(12) United States Patent
Hirano et al.

(10) Patent No.: US 7,120,551 B2
(45) Date of Patent: Oct. 10, 2006

(54) METHOD FOR ESTIMATING EMI IN A SEMICONDUCTOR DEVICE

(75) Inventors: Shozo Hirano, Osaka (JP); Kenji Shimazaki, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/052,788

(22) Filed: Feb. 9, 2005

(65) Prior Publication Data
US 2005/0177334 A1    Aug. 11, 2005

(30) Foreign Application Priority Data
Feb. 9, 2004    (JP) .............................. 2004-031951

(51) Int. Cl.
*G06F 19/00*    (2006.01)
(52) U.S. Cl. .................. 702/117; 702/118; 702/65; 702/64; 716/4
(58) Field of Classification Search ................ 702/117, 702/57, 64, 65, 118, 123, 119, 179; 716/4
See application file for complete search history.

(56) References Cited

U.S. PATENT DOCUMENTS

| | | | | |
|---|---|---|---|---|
| 4,939,681 A | * | 7/1990 | Yokomizo et al. ............ 703/14 |
| 5,638,294 A | * | 6/1997 | Sasada ............................ 716/5 |
| 6,038,383 A | * | 3/2000 | Young et al. ................... 716/5 |
| 6,237,126 B1 | * | 5/2001 | Bonitz ............................. 716/4 |
| 6,519,748 B1 | * | 2/2003 | Sakamoto ....................... 716/6 |
| 6,615,394 B1 | | 9/2003 | Ogawa et al. .................. 716/5 |
| 2002/0045995 A1 | | 4/2002 | Shimazaki et al. ........... 702/72 |
| 2003/0057966 A1 | | 3/2003 | Shimazaki et al. ......... 324/628 |

FOREIGN PATENT DOCUMENTS

JP    2003-30273    1/2003

* cited by examiner

*Primary Examiner*—Hal D. Wachsman
(74) *Attorney, Agent, or Firm*—McDermott Will & Emery LLP

(57) ABSTRACT

The resistance value of a supply line (Rline), the resistance value of a decoupling capacitor (Rcap), and the resistance value of a transistor (Rmos) are separately calculated from mask layout information of a semiconductor integrated circuit. The resistance value between external terminals (Ri) is calculated from the resistance value Rline, the resistance value Rcap, and the resistance value Rmos.

13 Claims, 33 Drawing Sheets

FIG. 18

| | | | | | | | | | Probability of ON |
|---|---|---|---|---|---|---|---|---|---|
| A | 0 | 1 | 0 | 1 | 0 | 1 | 0 | 1 | |
| B | 0 | 0 | 1 | 1 | 0 | 0 | 1 | 1 | |
| C | 0 | 0 | 0 | 0 | 1 | 1 | 1 | 1 | |
| pa | ON | OFF | OFF | OFF | ON | OFF | OFF | OFF | $\frac{1}{4}$ |
| na | OFF | ON | ON | ON | OFF | ON | ON | ON | $\frac{3}{4}$ |
| pb | ON | ON | ON | ON | OFF | OFF | OFF | OFF | $\frac{1}{2}$ |
| nb | OFF | OFF | OFF | OFF | ON | ON | ON | ON | $\frac{1}{2}$ |
| pc | OFF | OFF | OFF | OFF | ON | ON | ON | ON | $\frac{1}{2}$ |
| nc | ON | ON | ON | ON | OFF | OFF | OFF | OFF | $\frac{1}{2}$ |
| D | 1 | 0 | 0 | 0 | 1 | 0 | 0 | 0 | |
| E | 0 | 0 | 0 | 0 | 1 | 1 | 1 | 1 | |
| pd | OFF | ON | ON | ON | OFF | OFF | OFF | OFF | $\frac{3}{8}$ |
| nd | ON | OFF | OFF | OFF | ON | ON | ON | ON | $\frac{5}{8}$ |

METHOD FOR ESTIMATING EMI IN A SEMICONDUCTOR DEVICE

CROSS-REFERENCE TO RELATED APPLICATION

This application claims priority under 35 U.S.C. § 119(a) on Japanese Patent Application No. 2004-31951 filed on Feb. 9, 2004, the entire contents of which are hereby incorporated by reference.

BACKGROUND OF THE INVENTION

1. Field of the Invention

The present invention relates to a method for calculating the resistance value inside a semiconductor integrated circuit.

2. Description of the Prior Art

The large scale semiconductor integrated circuit (LSI circuit) has been a key device indispensable for electric and electronic devices. In general, a high speed operable LSI circuit is used in order to improve the performance of electric and electronic devices. However, on the other hand, the high speed operable LSI circuit is a source of high frequency noise.

FIG. 1 shows a model of an internal structure of an LSI circuit. The LSI circuit incorporates resistance R, capacitor C, inductor L, etc., and these components produce electromagnetic interference (EMI). If EMI leaks outside the LSI circuit, a malfunction can be caused in other devices. Thus, it is necessary to provide any countermeasure against the noise that leaks outside the LSI device. However, if the noise check is performed on a completed LSI circuit and noise is detected, the necessity of redesigning the LSI circuit arises, and such a procedure is inefficient.

Noise is produced by each of inductor L, capacitor C and resistance R. If it is possible to estimate EMI produced by these components before designing a LSI circuit, it is possible to efficiently design the LSI circuit. A method for checking EMI produced by capacitor C, inductor L and resistance R before designing a LSI circuit has already been known (see Japanese Unexamined Patent Publication No. 2003-30273).

FIG. 41 illustrates a conventional method for estimating EMI produced by a resistance inside an LSI circuit using a power-supply LPE (Layout Parasitic Extraction) method and a reduction method. As shown in FIG. 41, a power supply line 201 present between external terminal VDD and external terminal VSS (not shown) is extracted from mask layout information. The extracted power supply line 201 is subjected to power-supply LPE method S201, whereby the characteristics of the resistances that constitute the power supply line 201 are determined, and a post layout netlist 202 is obtained. Further, the post layout netlist 202 is subjected to reduction method S202, whereby a large number of resistances are calculated as a single resistance, and the resistance value can be actually calculated.

FIG. 42 illustrates a conventional method for estimating EMI produced by a resistance inside an LSI circuit using a power supply resistance of a primary main power supply line. As shown in FIG. 42, the power supply resistance 213 is calculated by power supply resistance calculation S211 from a main power supply WL 211 which is information about a main-line power supply having a wire width equal to or greater than a predetermined value, and a sheet resistance 212 which has information of the resistance per sheet. Since the primary main line is a simple power supply network, a large number of resistances can be calculated as a single resistance using the LPE method and the reduction method. Further, for the purpose of determining a value with consideration for a wire power supply line, estimation means S212 performs a coefficient multiplication process on the power supply resistance 213 to determine resistance Ri.

However, the conventional methods have the following disadvantages.

In the conventional method which uses the power supply LPE method and the reduction method, an operation is performed such that a large number of resistances present inside the circuit are regarded as a single resistance. However, in a huge system LSI circuit incorporating ten millions of transistors, it is extremely difficult to calculate the resistance of a single transistor even if the reduction method is used because of the limit of the capacity of a computer. Further, an enormous amount of operations are required, and accordingly, the operations take a very long time.

In the conventional method which uses a power supply resistance of a primary main power supply line, only the primary main power supply line is extracted to calculate the resistance. Thus, the resistance value can be calculated even in a complicated circuit including a large number of resistances. However, the resistance of the elements other than the primary main power supply line is not considered in the calculation, and the calculation accuracy of the resistance value is accordingly low.

In view of the above problems, an objective of the present invention is to calculate the resistance value inside a semiconductor integrated circuit with high accuracy within a short time interval as compared with the conventional methods.

SUMMARY OF THE INVENTION

In order to achieve the above objective, the present invention provides a method for calculating a resistance value inside a semiconductor integrated circuit which includes first and second supply lines electrically connected to first and second external terminals and a plurality of cells which are connected between the first and second supply lines and have any one of a transistor and a decoupling capacitor, the method comprising: first step of calculating a first resistance value, which is a resistance value of the first and second supply lines, from mask layout information of the semiconductor integrated circuit; second step of calculating a second resistance value, which is a resistance value of the decoupling capacitor of the plurality of cells, from the mask layout information; third step of calculating a third resistance value, which is a resistance value of the transistor of the plurality of cells, from the mask layout information; and fourth step of calculating a resistance value between the first and second external terminals from the first to third resistance values respectively obtained at the first to third steps.

According to the present invention, the first resistance value, which is the resistance value of a supply line, the second resistance value, which is the resistance value of a decoupling capacitor, and the third resistance value, which is the resistance value of a transistor, are separately calculated. Then, the resistance value between external terminals is calculated from the first to third resistance values. With this structure, the resistance value inside a semiconductor integrated circuit can be determined with high accuracy within a short time period.

In the resistance value calculation method of the present invention, preferably, the resistance value calculated at the fourth step, Ri, is calculated by the following operation: Ri=Rline+(1/(1/Rmos+1/Rcap)) where Rline, Rcap and Rmos are the first, second and third resistance values.

In the resistance value calculation method of the present invention, preferably, in the first step the following steps are executed on each of the first and second supply lines: the step of determining for each of the cells on the assumption that electric currents flows through the plurality of cells a current value through each said cell and a voltage drop value at the supply line; the step of calculating a resistance value from the determined current value and voltage drop value for each of the cells; the step of determining a total resistance value for a case where the calculated resistance values are connected in parallel as a resistance value of the supply line; and the step of determining the first resistance value using the resistance value obtained for the first supply line and the resistance value obtained for the second supply line.

In the resistance value calculation method of the present invention, preferably, in the first step the following steps are executed on each of the first and second supply lines: the step of determining on the assumption that electric currents flow through the plurality of cells a total sum of the electric currents flowing through the cells and an average value of voltage drop values of the cells; the step of calculating a resistance value of the supply line from the determined total sum of the electric currents and the average value of the voltage drop values; and the step of determining the first resistance value using the resistance value obtained for the first supply line and the resistance value obtained for the second supply line.

Preferably, the first step includes the step of performing IR-DROP simulation to determine a voltage drop value at any one of a supply line and a cell.

In the resistance value calculation method of the present invention, preferably, the second step includes the steps of: performing an LPE process on the mask layout information to obtain resistance information about each of the cells which have the decoupling capacitors; determining resistance values of the cells which have the decoupling capacitors from the obtained resistance information; and determining a total resistance value for a case where the determined resistance values are connected in parallel as the second resistance value.

In the resistance value calculation method of the present invention, preferably, the third step includes the steps of: determining a resistance value of a cell for each cell type as a specific cell resistance; determining the number of cells included in the semiconductor integrated circuit for each cell type as specific cell number; calculating resistance values of the cells included in the semiconductor integrated circuit for each cell type using the determined specific cell resistance and the specific cell number; and determining a total resistance value for a case where the determined resistance values are connected in parallel as the third resistance value.

Preferably, the step of determining the specific cell resistance includes the steps of: determining an average value of gate widths of transistors of said cell type as gate width statistical information; determining an average value of the number of serially-connected transistors of the cells of said cell type as intracell serial coefficient statistical information; determining an average value of the number of parallelly-connected transistors of the cells of said cell type as multi-stage cell coefficient statistical information; and calculating a specific cell resistance of a cell of said cell type using the gate width statistical information, the intracell serial coefficient statistical information, the multi-stage cell coefficient statistical information, an input state probability which is the probability of the transistor being turned on, and an ON-resistance value of a transistor having a predetermined gate width.

Preferably, the specific cell resistance, c, is calculated by the following operation: $c=(\alpha \times \gamma \times a \times w/b)/\beta$ where $\alpha$ is the input state probability, $\gamma$ is the intracell serial coefficient statistical information, a is the ON-resistance value, w is the predetermined gate width, b is the gate width statistical information, and $\beta$ is the multi-stage cell coefficient statistical information.

In the resistance value calculation method of the present invention, preferably, the third step includes the steps of: determining the resistance value of a cell only for one cell type as a specific cell resistance; determining the number of cells included in the semiconductor integrated circuit; and determining a total resistance value for a case where the determined number of the specific cell resistances are connected in parallel as the third resistance value.

Preferably, the step of determining the specific cell resistance includes the steps of: determining an average value of gate widths of transistors of said cell type as gate width statistical information; determining an average value of the number of serially-connected transistors of the cells of said cell type as intracell serial coefficient statistical information; determining an average value of the number of parallelly-connected transistors of the cells of said cell type as multi-stage cell coefficient statistical information; and calculating a specific cell resistance of a cell of said cell type using the gate width statistical information, the intracell serial coefficient statistical information, the multi-stage cell coefficient statistical information, an input state probability which is the probability of the transistor being turned on, and an ON-resistance value of a transistor having a predetermined gate width.

Preferably, the specific cell resistance, c, is calculated by the following operation: $c=(\alpha \times \gamma \times a \times w/b)/\beta$ where $\alpha$ is the input state probability, $\gamma$ is the intracell serial coefficient statistical information, a is the ON-resistance value, w is the predetermined gate width, b is the gate width statistical information, and $\beta$ is the multi-stage cell coefficient statistical information.

According to the present invention, the resistance present inside an LSI circuit can be determined with high accuracy within a short time period. Thus, it is possible to estimate EMI produced by an internal component of the LSI circuit. Therefore, it is not necessary to redesign the LSI circuit even if it is a high speed LSI circuit having a larger scale.

BRIEF DESCRIPTION OF THE DRAWINGS

FIG. 14A is a symbolic diagram of a multi-stage cell. FIG. 14B is an example of an equivalent resistance model of the cell of FIG. 14A.

FIG. 15A shows a symbol of a MOS transistor. FIG. 15B shows a typical equivalent model of the MOS transistor.

FIG. 18 illustrates the relationship between combinations of inputs and transistor operations in the example of FIG. 17.

DESCRIPTION OF THE PREFERRED EMBODIMENTS

Figure 1:
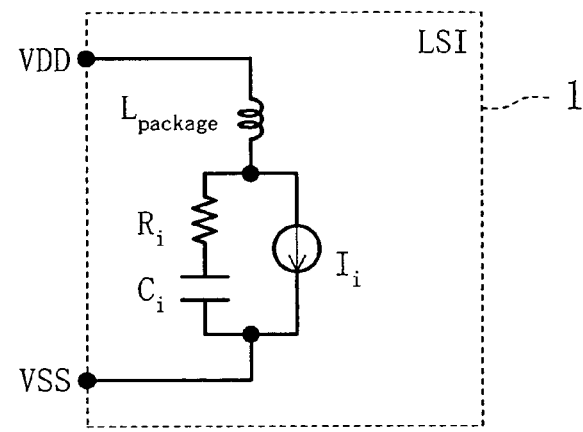
FIG. 1 shows a model of an internal structure of an LSI circuit.

Hereinafter, embodiments of the present invention are described with reference to the drawings. It should be noted that, in the descriptions provided below, the same elements as those described in the above section of background techniques are denoted by the same reference numerals, and the detailed descriptions thereof are herein omitted.

The present invention may be used for a purpose other than the EMI estimation. For example, the present invention can be used for extracting the resistance from the inside of an LSI circuit.

Embodiment 1

FIG. 1 shows a model of an internal structure of a semiconductor integrated circuit (LSI circuit). The LSI internal model 1 shown in FIG. 1 includes resistance $R_i$, capacitor $C_i$ and inductor $L_{package}$. These elements are electrically connected between external terminal VDD and external terminal VSS. Electric current $I_i$ flows through these elements. External terminal VDD and external terminal VSS correspond to pads on a mask layout. A cell is the minimum unit in the design of the LSI circuit. The LSI circuit is designed by connecting a plurality of cells.

Figure 2:
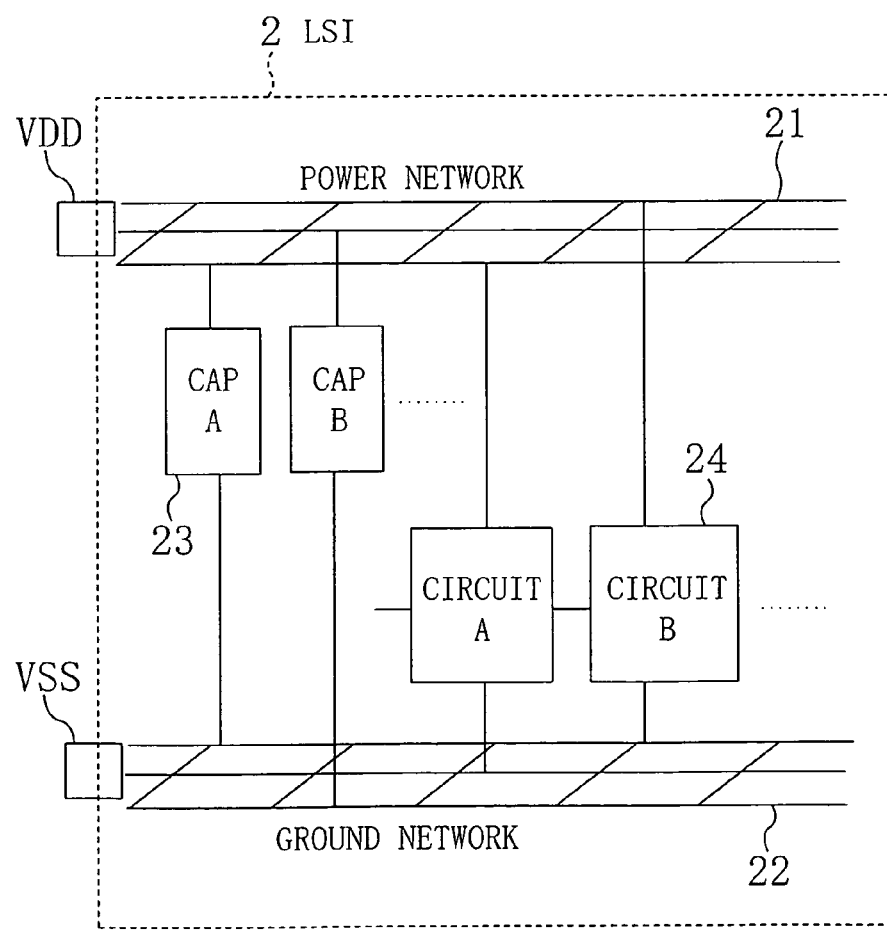
FIG. 2 is a concept diagram of an internal structure of an LSI circuit that is prerequisite for a resistance value calculation method of the present invention.

FIG. 2 is a concept diagram of an internal structure of a semiconductor integrated circuit (LSI circuit) that is prerequisite for implementation of a resistance value calculation method of the present invention. FIG. 2 shows elements which can be resistances inside the LSI circuit 2 when the power is supplied to external terminals VDD and VSS.

According to the present invention, the elements that can be resistances inside the LSI circuit are classified into three groups as follows. These are described in the mask layout information of the semiconductor integrated circuit.

The first group encompasses power supply lines and ground lines. As shown in FIG. 2, a power supply line (first power supply line) 21 is connected to external terminal VDD (first external terminal), and a ground line (second power supply line) 22 is electrically connected to external terminal VSS (second external terminal).

The second group encompasses cells which only include decoupling capacitance. Referring to FIG. 2, CAPs 23 are the cells which only include decoupling capacitance. The decoupling capacitance is formed by resistance R, capacitor C, inductor L, etc. The CAPs 23 are electrically connected between the power supply line 21 and the ground line 22.

Third group encompasses cells which include transistors. Referring to FIG. 2, CIRCUITs 24 are the cells which include transistors. The CIRCUITs 24 are electrically connected between the power supply line 21 and the ground line 22.

Figure 3:
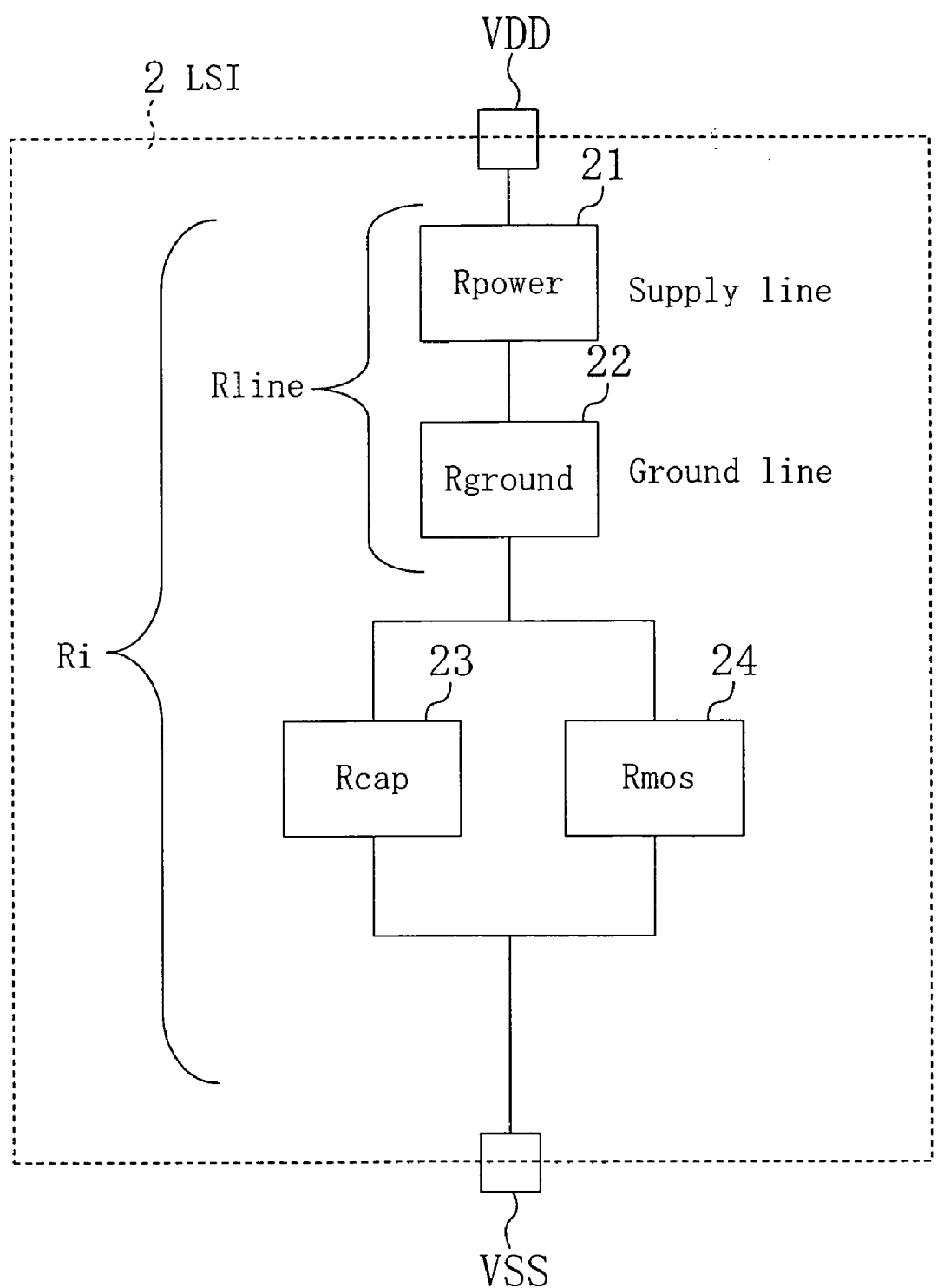
FIG. 3 shows the electrical connections of three systems of FIG. 2.

FIG. 3 shows the electrical connections of these three systems. In FIG. 3, the resistance of the power supply line 21 is Rpower, and the resistance of the ground line 22 is Rground. Between external terminals VDD and VSS of FIG. 2, the power supply line 21 and the ground line 22 are connected in series, and the sum of the resistances of these components is line resistance Rline.

The resistance of the CAP 23 which is formed by decoupling capacitance is capacitance resistance Rcap. The resistance of the CIRCUIT 24 which is formed by transistors is MOS resistance Rmos. Between external terminals VDD and VSS of FIG. 2, the CAPs 23 and the CIRCUITs 24 are connected in parallel. Therefore, capacitance resistance Rcap and MOS resistance Rmos are connected in parallel as shown in FIG. 3.

In this way, the resistance components of the three systems, Rline, Rcap and Rmos, are calculated and added together in series and in parallel, whereby the total sum of the resistances inside the LSI circuit 2, resistance Ri, is determined.

Figure 4:
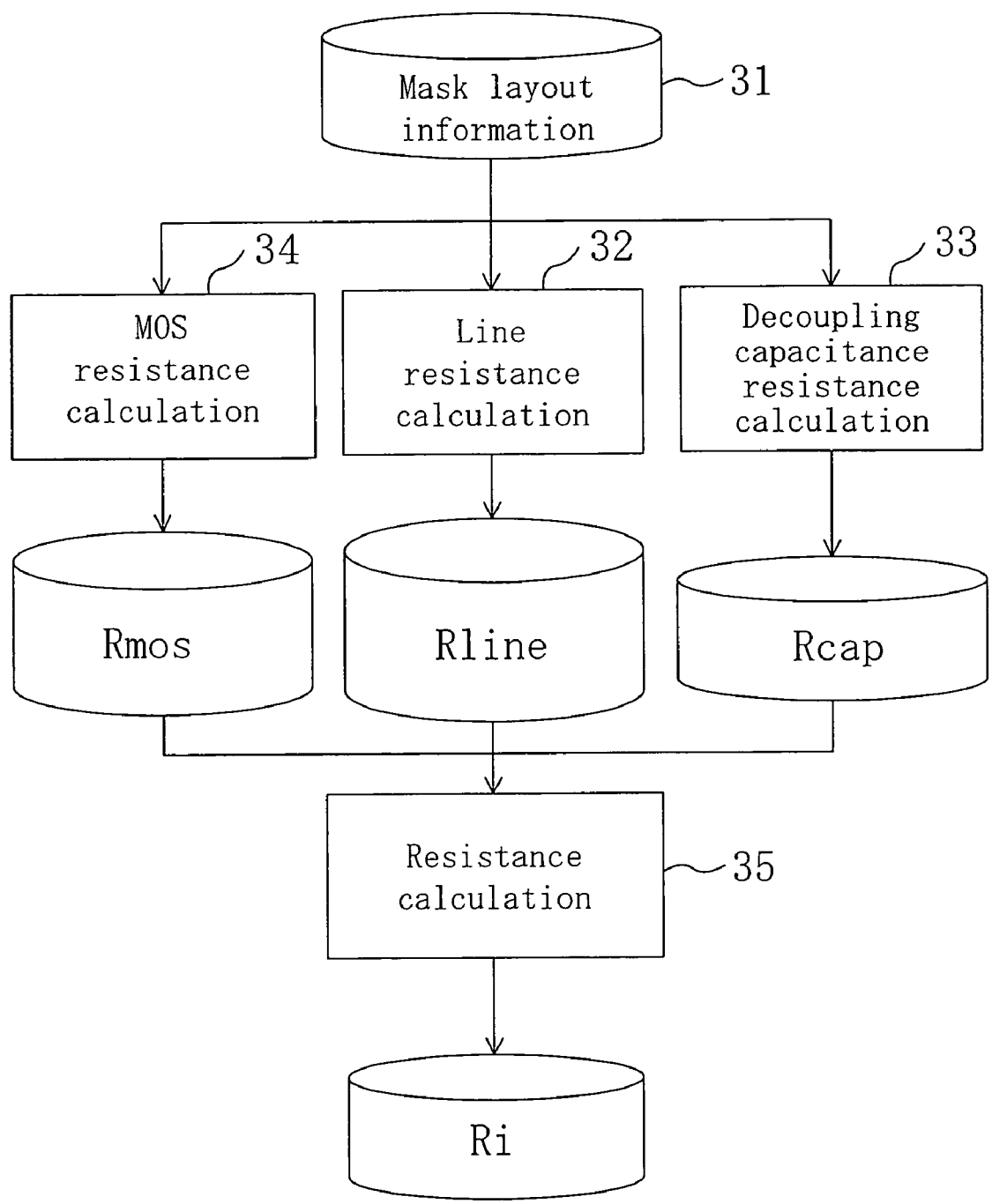
FIG. 4 shows an entire structure for implementation of the resistance value calculation method according to embodiment 1 of the present invention.

FIG. 4 shows an entire structure for implementation of the resistance value calculation method of embodiment 1. As shown in FIG. 4, mask layout information 31, which includes various information, is input to a line resistance calculation section 32, a decoupling capacitance resistance calculation section 33, and a MOS resistance calculation section 34. The line resistance calculation section 32 calculates line resistance Rline (first resistance value). The decoupling capacitance resistance calculation section 33 calculates capacitance resistance Rcap (second resistance value). The MOS resistance calculation section 34 calculates MOS resistance Rmos (third resistance value). Details of the line resistance calculation section 32, the decoupling capacitance resistance calculation section 33 and the MOS resistance calculation section 34 will be described later.

Then, a resistance calculation section 35 calculates the total sum of the resistances inside the LSI circuit, resistance Ri, from line resistance Rline, capacitance resistance Rcap and MOS resistance Rmos. The calculation in the resistance calculation section 35 is carries out based on expression (1):

$$Ri = Rline + (1/(1/Rmos + 1/Rcap)) \quad (1)$$

<Calculation of Line Resistance>

Figure 5:
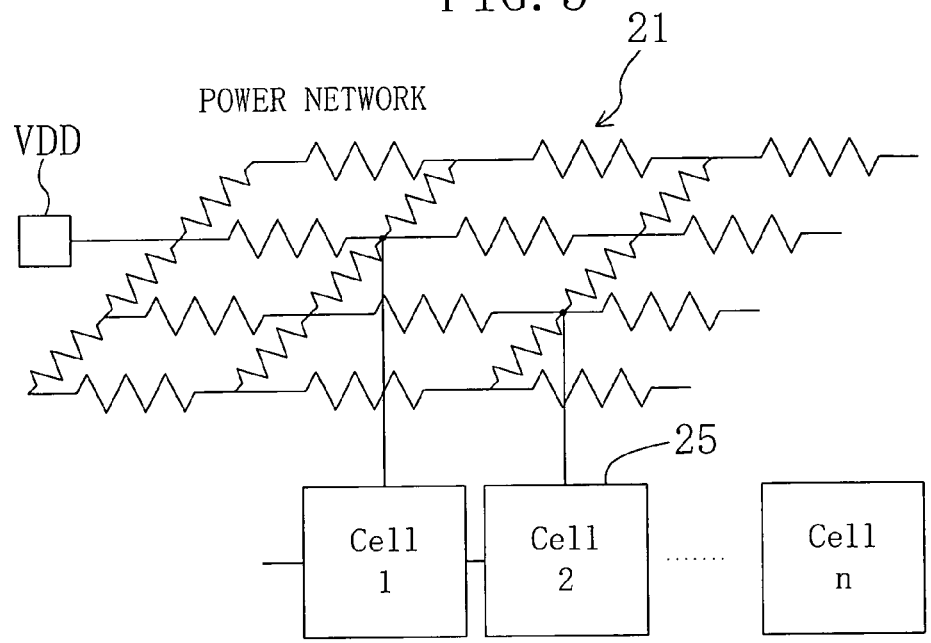
FIG. 5 shows a structure prerequisite for line resistance calculation.

FIG. 5 is a concept diagram of a structure that is prerequisite for the process of the line resistance calculation section 32. Herein, the descriptions are provided as to the power supply line 21. However, it should be noted that the resistance value of the ground line 22 can be calculated through the same process as that for the power supply line 21. The power supply line 21 is electrically connected to external terminal VDD. An electric current is supplied from external terminal VDD to the power supply line 21 by the operation of cells 25. The power supply line 21, external terminal VDD and the cells 25 are included in the mask layout information.

Figure 6:
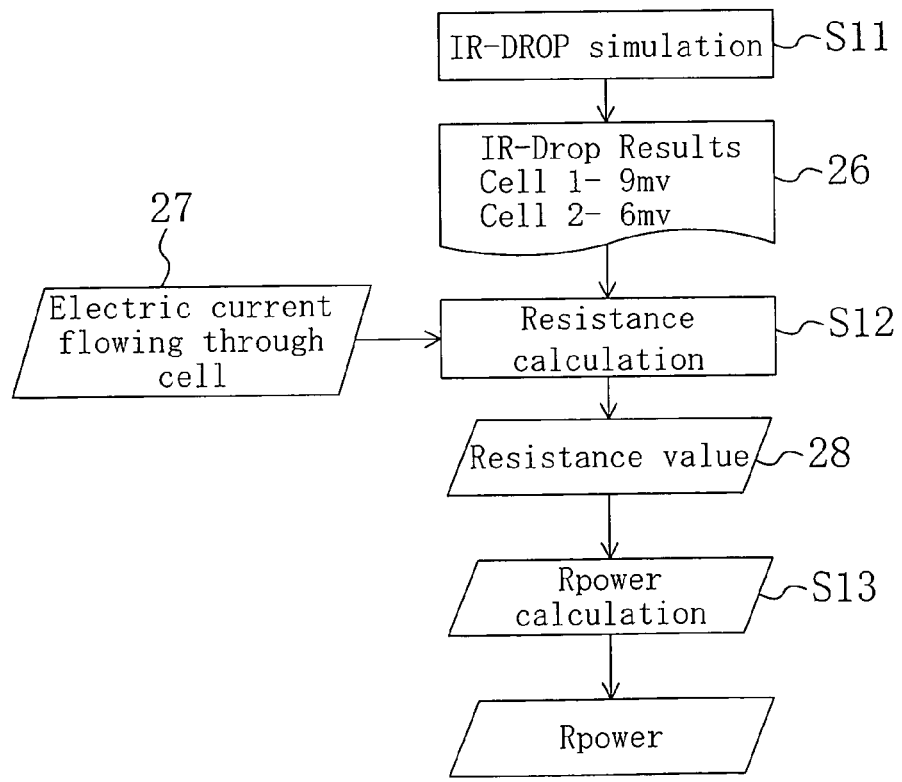
FIG. 6 illustrates a line resistance calculation process.

A feature of the method of embodiment 1 resides in using IR-Drop simulation based on a voltage drop analysis result of the power supply line (or ground line). FIG. 6 illustrates a line resistance calculation process.

For convenience of calculation, it is virtually assumed that an electric current flows through each of the cells 25. In this case, the resistance value of the power supply line 21 is determined according to the flow of electric currents through the cells 25. For example, in FIG. 5, resistances R1, R2, . . . , Rn are each determined from the voltage drop value in the power supply line 21 according to the flow of electric currents through n cells 25 (Cell 1 to Cell n). The voltage drop value in the power supply line 21 can be determined by IR-Drop simulation, for example. The total sum of the electric currents flowing through Cell 1 to Cell n corresponds to the electric current which flows through the power supply line 21 when an electric currents flows through all the cells. Thus, power supply resistance Rpower can be calculated on the assumption that resistances R1, R2, . . . Rn are connected in parallel.

As shown in FIG. 6, a voltage drop value 26 in the power supply line 21 is determined for each cell 25 by performing IR-Drop simulation S11. The voltage drop value 26 and an electric current 27 flowing through the cell 25 are used in the resistance calculation process S12 to determine a resistance value 28. Since the power supply resistance can be calculated on the assumption that the resistance values 28, i.e., resistances R1, R2, . . . , Rn, are connected in parallel as described above, power supply resistance Rpower is determined by Rpower calculation process S13.

Ground resistance Rground can be determined in the same way. Line resistance Rline can be determined from supply resistance Rpower and ground resistance Rground.

It should be noted that the voltage drop value determined by IR-Drop simulation S11 may only be a dropped voltage in the power supply line 21 or may be a sum of the dropped voltage in the power supply line 21 and a dropped voltage in a line (not shown) electrically connecting the power supply line 21 and the cell 25. The method for obtaining the voltage drop value is not limited to IR-Drop simulation, but any other method may be employed.

Figure 7:
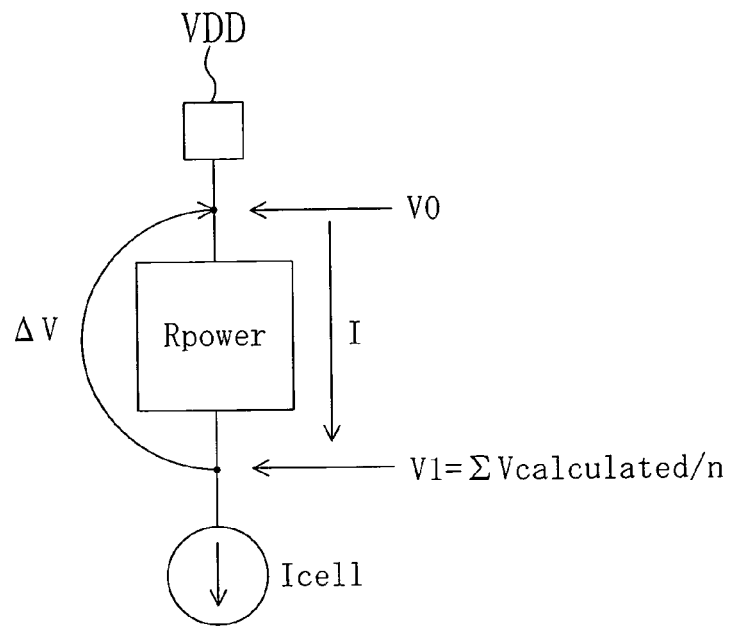
FIG. 7 conceptually illustrates another line resistance calculation process.

Alternatively, the line resistance, the power supply resistance and the ground resistance can be calculated as illustrated in FIG. 7. Electric current I which flows through power supply resistance Rpower is the sum of electric currents flowing into all the cells, Icell, which is the information input into IR-Drop simulation S11. Potential difference ΔV between power supply resistances Rpower is a difference between supply voltage V0 input into IR-Drop simulation S11 and average value V1 of the voltage drop value in each cell which is obtained as a result of IR-Drop simulation S11. In this case, power supply resistance Rpower can be determined by the following expression:

$$Rpower = \Delta V / Icell$$

$$(\Delta V = V0 - V1)$$

As a matter of course, ground resistance Rground can be determined in the same way, and line resistance Rline can be obtained from power supply resistance Rpower and ground resistance Rground.

Figure 8:
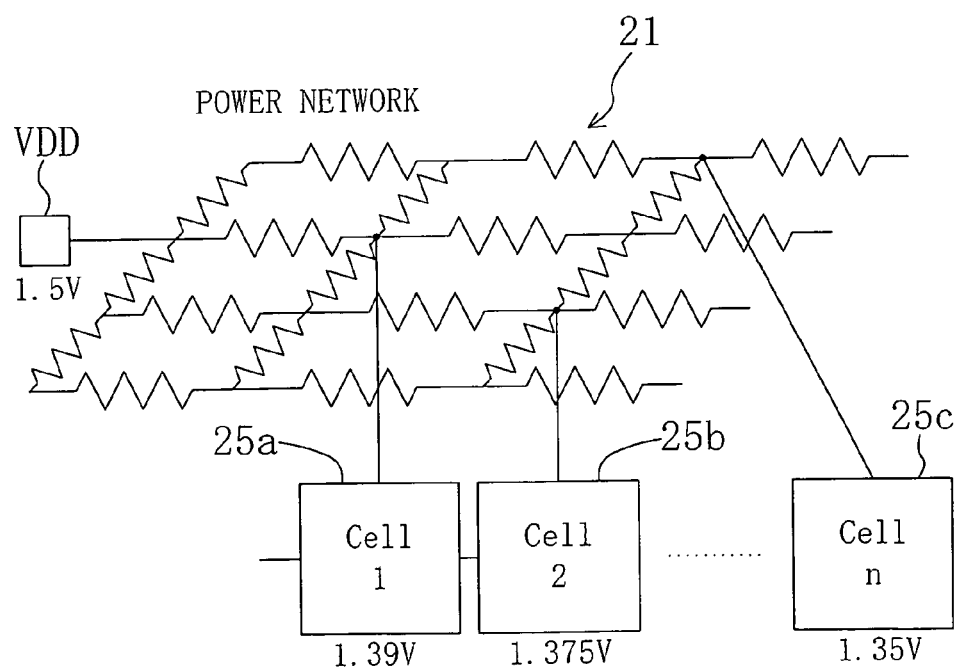
FIG. 8 illustrates the line resistance calculation process with specific values.

Next, the above example is described with specific numerical values. As shown in FIG. 8, it is assumed herein that three cells 25a, 25b and 25c are electrically connected, and a voltage of 1.5 V is applied to external terminal VDD. A voltage drop occurs in the route from external terminal VDD through the power supply line 21 to the cells 25a to 25c. The voltage drop results in that the voltages applied to the cells 25a, 25b and 25c are 1.39 V, 1.375 V and 1.35 V, respectively.

Next, the electric currents flowing through the respective cells 25a to 25c are considered. Electric current I can be determined from consumed power P and voltage V as follows:

$$I = P/V$$

Since voltage V applied to external terminal VDD is 1.5 V in this example, electric current I can be obtained by determining the value of power P consumed by the power supply line 21. Herein, consumed power P can be expressed by the following expression, although any other method may be used for determining consumed power P:

$$P = (1 \times C \times V^2 \times F)/2$$

where C is the load capacitance which is determined for each cell, V is the value of a voltage applied to power source line VDD, and F is the frequency which determines the circuit operation speed. Voltage V is 1.5 V. Frequency F of the power supply line 21 is $200 \times 10^6$ Hz.

Assuming that load capacitance C of the cell 25a is $6.6 \times 10^{-10}$, consumed power P is determined as follows:

$$P = (1 \times 6.6 \times 10^{-10} \times (1.5)^2 \times 200 \times 10^6)/2$$
$$= 0.15 \text{ W}$$

Accordingly, electric current I is determined as follows:

$$I = 0.15 \text{ W}/1.5 \text{ V}$$
$$= 0.1 \text{ A}$$
$$= 100 \text{ mA}$$

Thus, the electric current flowing through the cell 25a is 100 mA, and the voltage at the cell 25a is 1.39 V.

The same process is also applied to the cell 25b. Assuming that load capacitance C of the cell 25b is $8.0 \times 10^{-10}$, consumed power P is determined as follows:

$$P = (1 \times 8.0 \times 10^{-10} \times (1.5)^2 \times 200 \times 10^6)/2$$
$$= 0.18 \text{ W}$$

Accordingly, electric current I is determined as follows:

$$I = 0.18 \text{ W}/1.5 \text{ V}$$
$$= 0.12 \text{ A}$$
$$= 120 \text{ mA}$$

Thus, the electric current flowing through the cell 25b is 120 mA, and the voltage at the cell 25b is 1.375 V.

Assuming that load capacitance C of the cell 25c is $6.6 \times 10^{-10}$, the electric current flowing through the cell 25c is 100 mA, and the voltage at the cell 25c is 1.39 V.

The resistance values of the cells 25a to 25c are now calculated. Resistance value Ra of the cell 25a is determined as follows:

$$Ra = (1.5 \text{ V} - 1.39 \text{ V})/0.1 \text{ A}$$
$$= 1.1 \text{ }\Omega$$

In the same way, Resistance values Rb and Rc of the cells 25b and 25c are determined as follows:

$$Rb = (1.5 \text{ V} - 1.375 \text{ V})/0.12 \text{ A}$$
$$= 0.92 \text{ }\Omega$$

$$Rc = (1.5 \text{ V} - 1.35 \text{ V})/0.1 \text{ A}$$
$$= 1.5 \text{ }\Omega$$

Accordingly, power supply resistance Rpower is determined as follows:

$$Rpower = 1/[(1/Ra) + (1/Rb) + (1/Rc)]$$
$$= 1/[(1/1.1) + (1/0.92) + (1/1.5)]$$
$$= 0.37 \text{ }\Omega$$

Herein, assuming that for example ground resistance Rground and power supply resistance Rpower have the same value, line resistance Rline is determined as follows:

$$Rline = Rpower + Rground$$
$$= 0.37 \text{ }\Omega + 0.37 \text{ }\Omega$$
$$= 0.74 \text{ }\Omega$$

In this way, only the power supply line and the ground line are extracted, whereby not only the resistance of a main primary line but also the resistance of a wire line can be determined. Thus, even when it is a complicated line, the resistance value thereof can be calculated with high accuracy. Further, the resistance value can be calculated within a short time period by extracting only a power supply line or a ground line.

<Calculation of Decoupling Capacitance Resistance>

Figure 9:
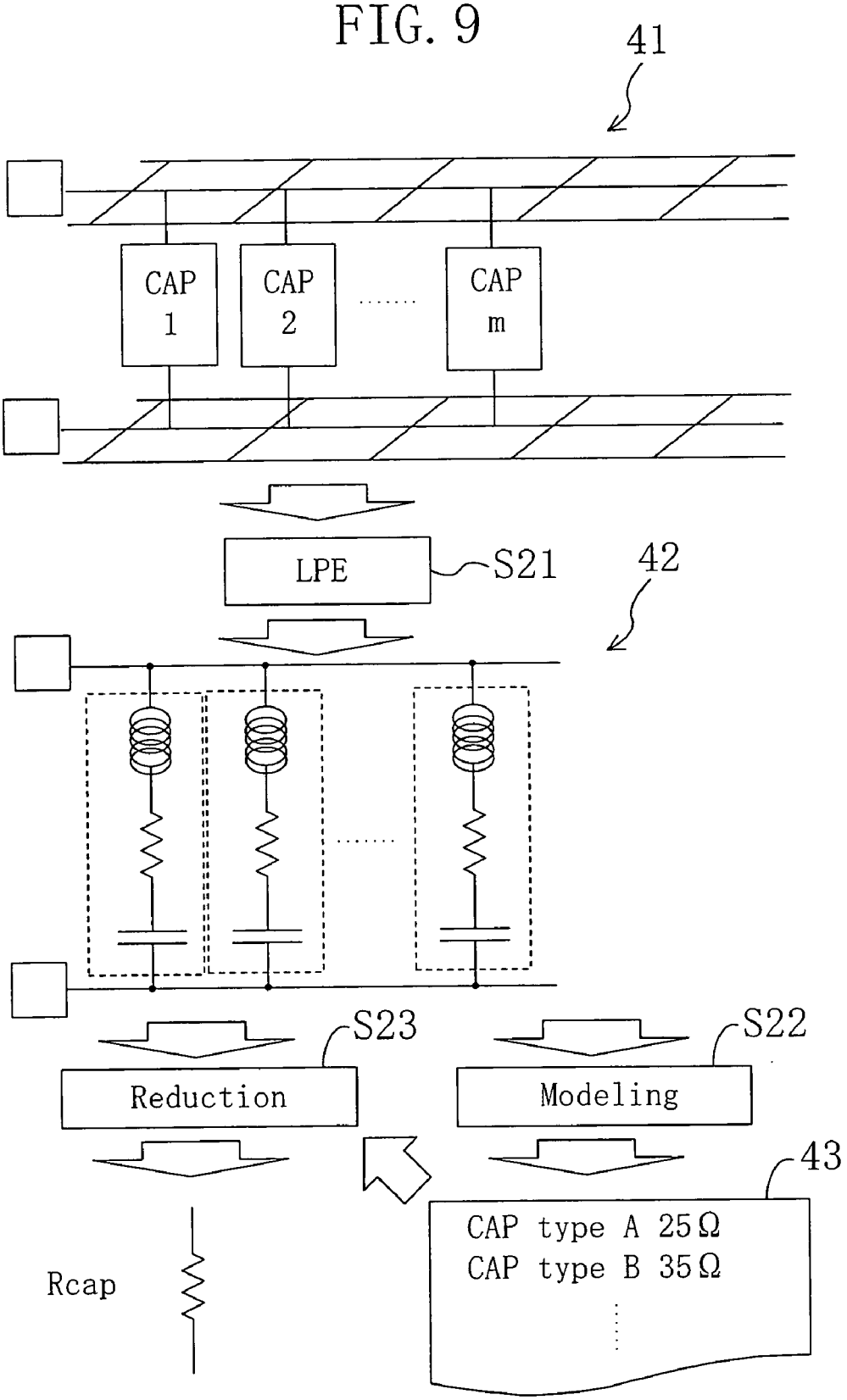
FIG. 9 conceptually illustrates a decoupling capacitance resistance calculation process.

FIG. 9 conceptually illustrates the process in the decoupling capacitance resistance calculation section 33. In FIG. 9, LPE process S21 is performed on mask layout information 41 of a decoupling capacitor device to obtain resistance information 42 of the decoupling capacitor device (post layout netlist). Herein, not only the information about resistance but also the information about capacitor C and inductor L are obtained. Then, modeling S22 is performed on the resistance information 42. Reduction S23 is performed based on the resistance values 43 of the cells including decoupling capacitance to determine capacitance resistance Rcap.

Figure 10:
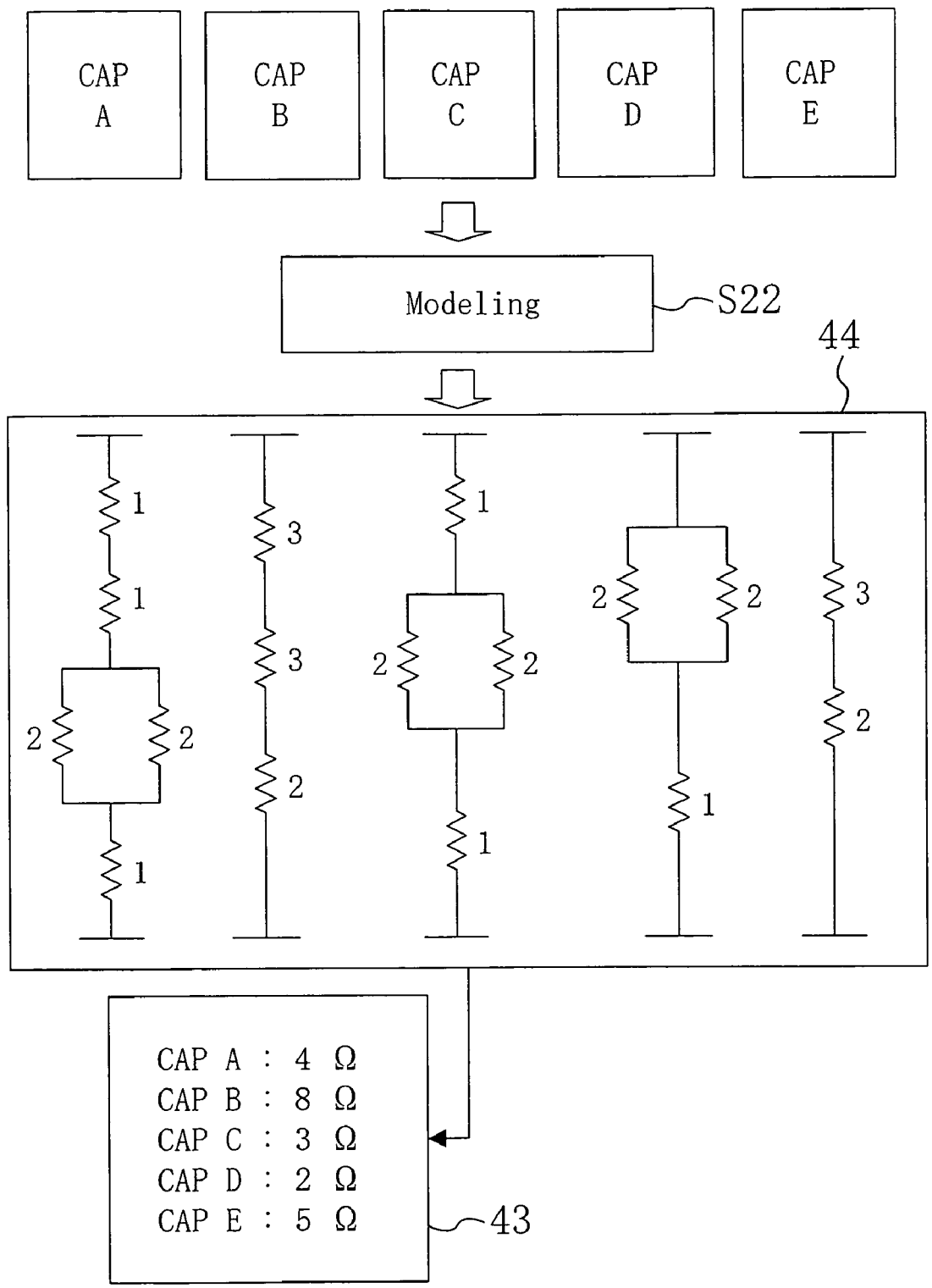
FIG. 10 illustrates a modeling process.

Modeling S22 is now described with reference to FIG. 10. Consider a case where there are 5 cells including decoupling capacitance, cell CAP_A to cell CAP_E. Modeling is performed on these cells, cell CAP_A to cell CAP_E, to clarify the characteristics of resistances, capacitors and inductors included therein. Then, only the resistances are extracted (data 44) to calculate the resistance values of cell CAP_A to cell CAP_E. As a result, according to the data 44, the resistance values of cell CAP_A to cell CAP_E are 4 $\Omega$, 8 $\Omega$, 3 $\Omega$, 2 $\Omega$ and 5 $\Omega$, respectively.

For example, consider a case where 3 cells CAP_A and 2 cells CAP_B are used. In this case, capacitance resistance Rcap is determined as follows:

$$Rcap = 1/(1/4 \times 3 + 1/8 \times 2)$$
$$= 1.0 \text{ }\Omega$$

As described above, only the cells including decoupling capacitance are considered to calculate the resistance value, whereby the resistance value can be calculated with high accuracy within a short time period.

<Calculation of MOS Resistance>

Figure 11:
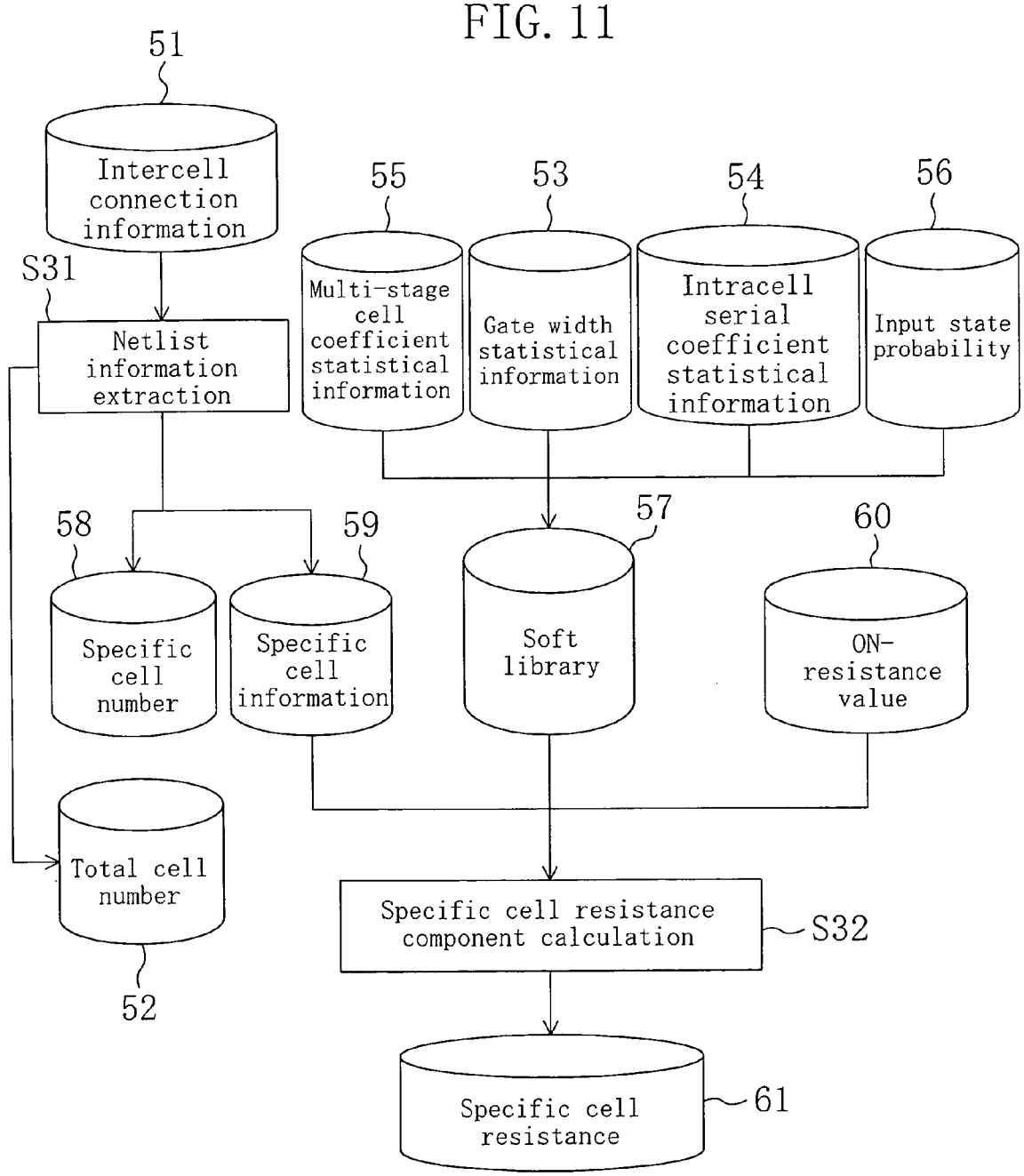
FIG. 11 illustrates a MOS resistance calculation process.
Figure 12:
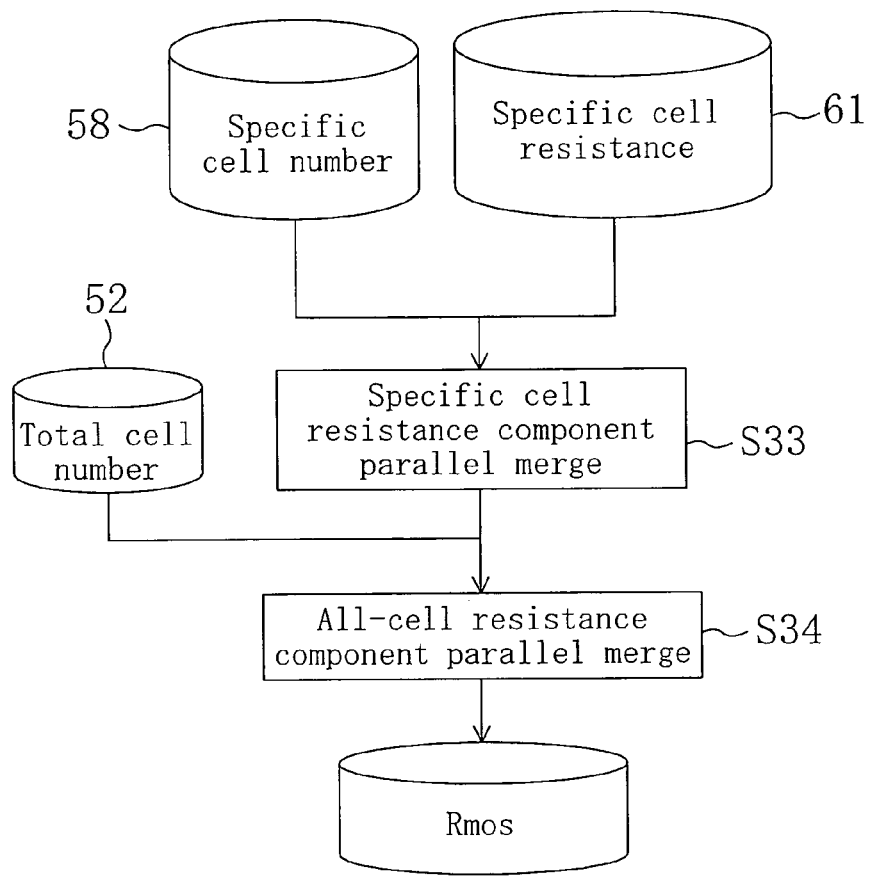
FIG. 12 illustrates a MOS resistance calculation process.

First, a method for calculating a specific cell resistance is described. FIGS. 11 and 12 illustrates the operation of the MOS resistance calculation section 34. In FIG. 11, intercell connection information 51 included in the mask layout information is used to perform netlist information extraction process S31, whereby the number of total cells used in an LSI circuit (total cell number 52) is obtained. As for a cell included in the intercell connection information 51, various statistical information including transistor gate width statistical information 53, intracell serial coefficient statistical information 54, and multi-stage cell coefficient statistical information 55, and the input state probability 56 are stored in a soft library 57.

In the first place, the transistor gate width statistical information 53 is described. The transistor gate width statistical information 53 is statistical data about the gate width of transistors included in a cell used in a LSI circuit. Herein, the transistor gate width statistical information 53 is the average value of the gate width. For example, one cell has N values of the gate width, value a1 to value aN, and average value ax of the gate width is the gate width statistical information of this cell. That is, this is expressed by the following expression:

$$(a1+a2+a3+ \ldots +aN)/N=ax$$

In the case where there are a plurality of types of cells, the gate width statistical information is provided for each cell type. It should be noted that N values of the gate width, a1 to aN, themselves may alternatively be used as the statistical information instead of the average value.

Figure 13:
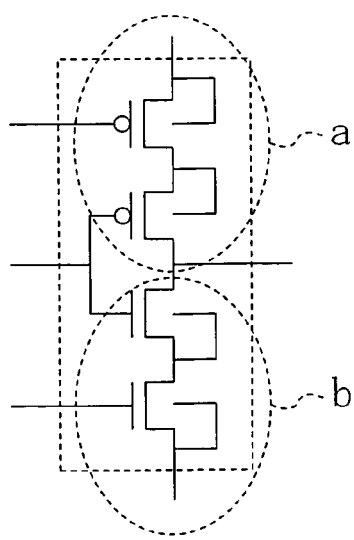
FIG. 13 is an example of a cell including serially-connected elements.

Next, the intracell serial coefficient statistical information 54 is described. The intracell serial coefficient statistical information 54 is statistical data about the number of serially-connected elements (stages) in a cell. Herein, the intracell serial coefficient statistical information 54 is the average value of the number of elements. FIG. 13 is an example of a cell including serially-connected elements. In FIG. 13, part a includes P-channel transistors, and part b includes N-channel transistors. In each of part a and part b, the serial coefficient, i.e., the number of serially-connected elements, is 2. That is, the cell of FIG. 13 has two serial coefficients "2", and the average value thereof is "2". Thus, the intracell serial coefficient statistical information of the cell of FIG. 13 is "2". It should be noted that the serial coefficient of each part itself may alternatively be used as the statistical information instead of the average value.

Figure 14A:
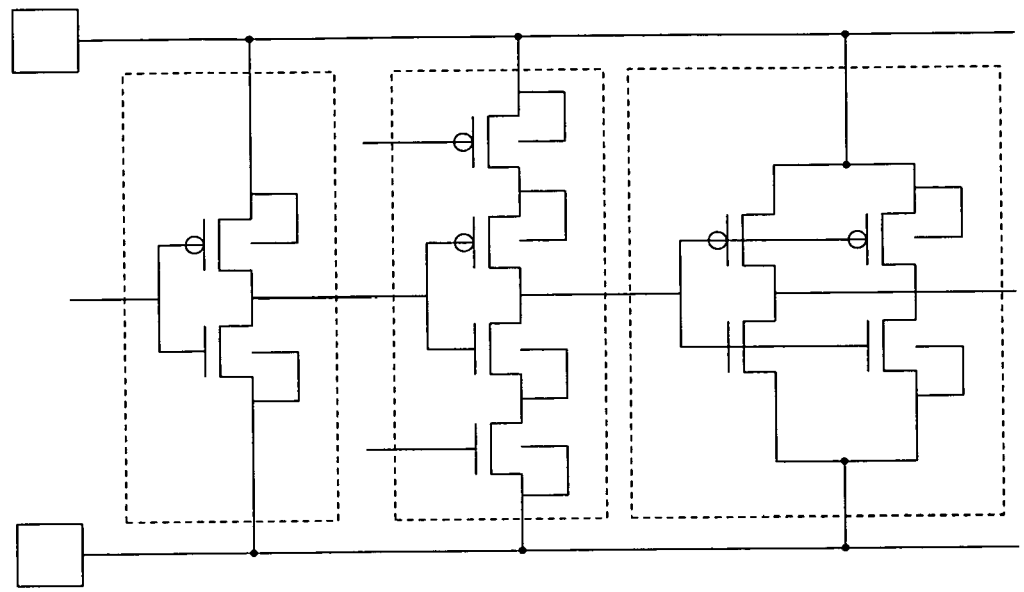
FIGS. 14A and 14B illustrate multi-stage cell coefficient statistical information.
Figure 14B:
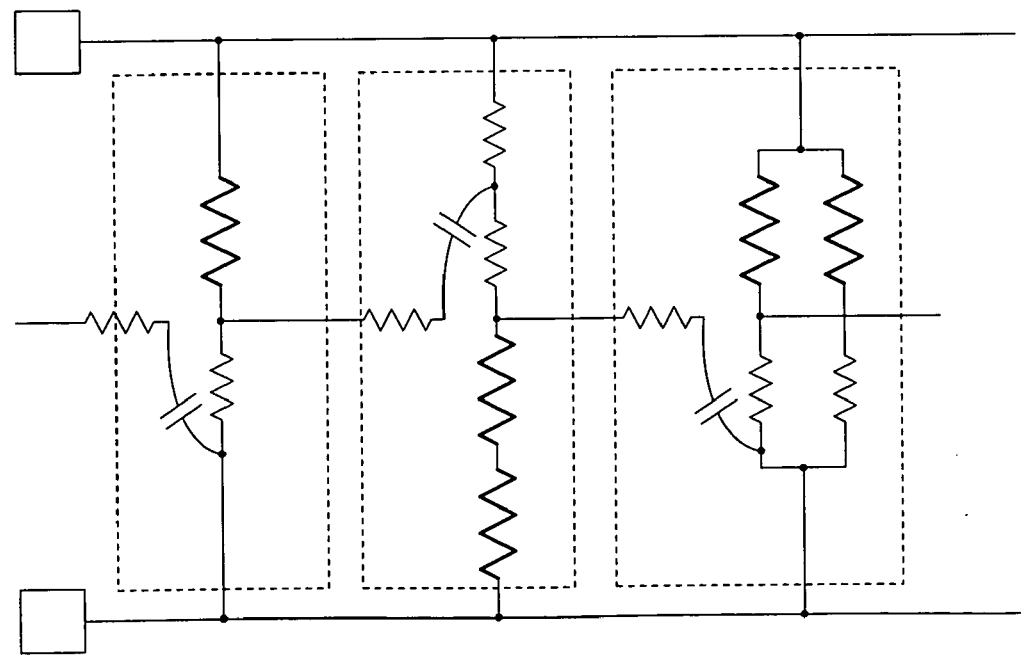

The multi-stage cell coefficient statistical information 55 is now described. The multi-stage cell coefficient statistical information 55 is statistical data about the number of parallelly-connected elements (stages) in a cell. Herein, the multi-stage cell coefficient statistical information 55 is the average value of the number of elements. FIG. 14A is a symbolic diagram of a multi-stage cell formed by three stages. FIG. 14B is an example of an equivalent resistance model of the cell of FIG. 14A. In the example of FIGS. 14A and 14B, the multi-stage cell coefficient, i.e., the number of parallelly-connected elements, is "3". This is because groups of transistors connected in series to the power supply line are divided by the units of a gate terminal, and three stages of such divisions are connected. The multi-stage cell coefficient is indispensable because it is one of the parameters that determine the resistance value.

Figure 15A:
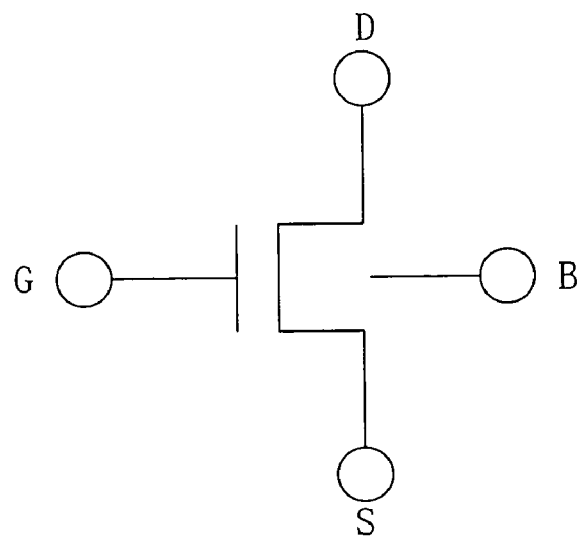
FIGS. 15A and 15B illustrate the input state probability.
Figure 15B:
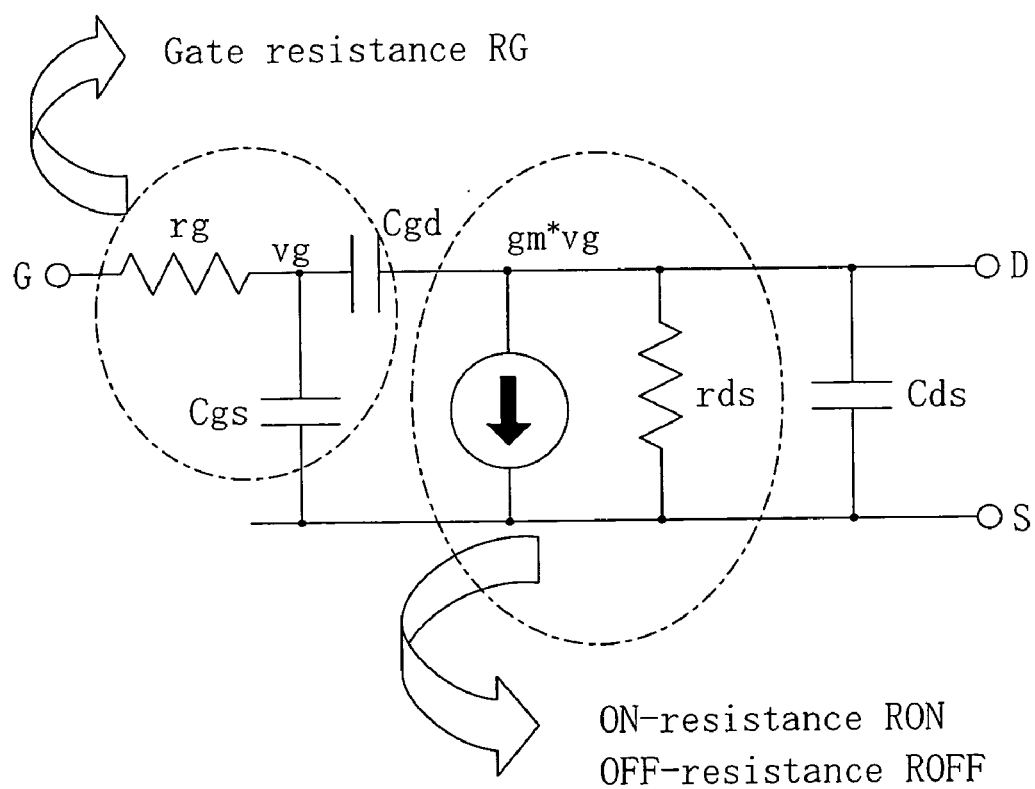

Next, the input state probability 56 is described. FIG. 15A shows a symbol of a MOS transistor. FIG. 15B shows a typical equivalent model of the MOS transistor. The equivalent model is a diagram where MOS transistors are replaced by resistances, capacitors, or the like. In the case where MOS transistors are replaced by resistances, capacitors, or the like, the value given to a gate G is important. The resistance of a MOS transistor changes between ON-resistance RON and OFF-resistance ROFF according to whether the value input to the gate G is "1" or "0".

In this example of embodiment 1, the following model is assumed with no consideration for OFF-resistance ROFF:

ROFF$\gg$RON$\gg$RG

ROFF$\gg$RON$\therefore$ROFF$\Rightarrow$neglected

RON$\gg$RG$\therefore$RG$\Rightarrow$neglected

This is because OFF-resistance ROFF is a very large value as compared with ON-resistance RON, and calculation thereof takes an enormous length of time. That is, the resistance value of a resistive path of a cell is determined by ON-resistance RON. The probability that a transistor takes ON-resistance RON is the input state probability 56.

The above-described information, i.e., the gate width statistical information 53, the intracell serial coefficient statistical information 54, the multi-stage cell coefficient statistical information 55, and the input state probability 56, are input to the soft library 57.

An ON-resistance value 60 is a value of a semiconductor production process, which is indispensable because it is one of the parameters that determine the resistance value. ON-resistance value RON is obtained by dividing applied voltage V by electric current Ids which flows when a transistor is ON:

$$Ron=V/Ids$$

where V is the voltage applied between drain and source electrodes, and Ids is en electric current which flows between source and drain electrodes when voltage V is applied.

Specific cell information 59 stores information about the types and the number of cells included in a semiconductor integrated circuit. In specific cell resistance component calculation process S32, the types of cells used in a semiconductor integrated circuit are specified based on the specific cell information 59, and corresponding information is read from the soft library 57 to calculate a specific cell resistance value 61. Specific cell resistance c is calculated as follows:

$$c=(\alpha \times \gamma \times a \times w/b)/\beta$$

where a is the ON-resistance value obtained with certain gate width w, $\beta$ is the multi-stage cell statistical coefficient, b is the gate width statistical coefficient, $\gamma$ is the intracell serial statistical coefficient, and $\alpha$ is the input state probability. Values $\beta$, b, $\gamma$ and $\alpha$ are obtained from the soft library 57. In this way, the specific cell resistance value 61 is obtained for each cell type.

Thereafter, as shown in FIG. 12, in specific cell resistance component parallel merge process S33, the resistance value of each cell type is calculated from specific cell resistance value 61, which is information indicative of the resistance value of each type of cells included in a netlist, and specific cell number 58 which is information indicative of the number of cells of each type. Then, in all-cell resistance component parallel merge process S34, the total cell number 52 which is information indicative of the number of cell types is used to calculate MOS resistance Rmos which is the resistance value of a cell including a transistor(s) on the assumption that resistance values of respective cell types are connected in parallel.

Figure 16A:
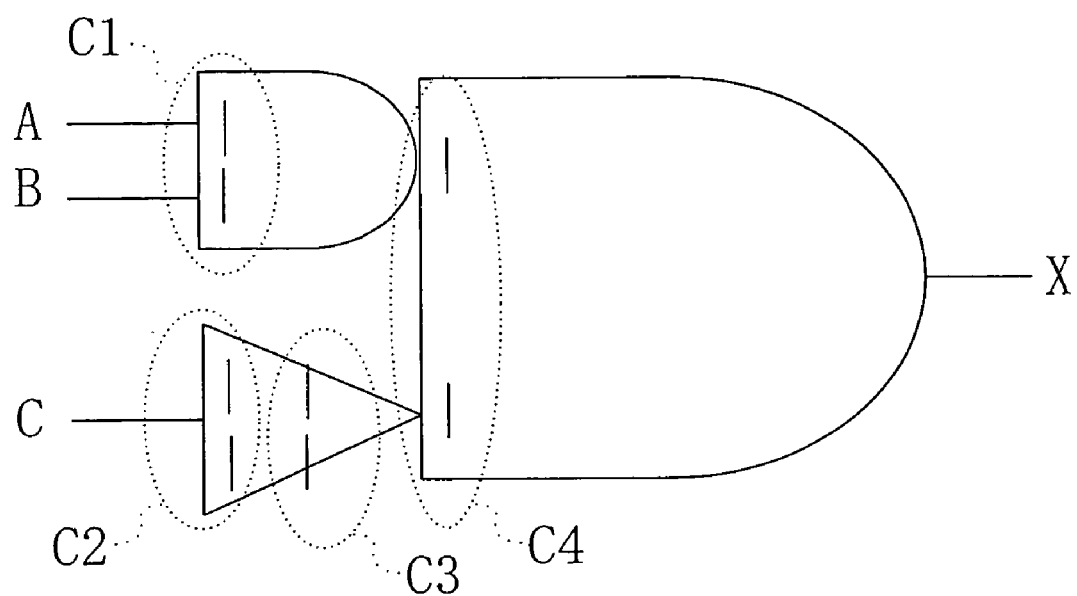
FIGS. 16A and 16B show general structures of elements.
Figure 16B:
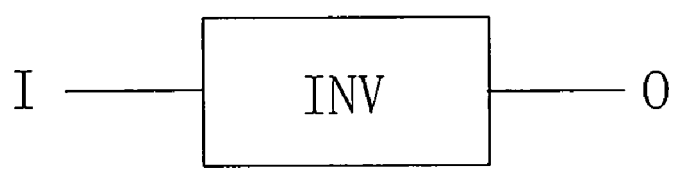

Next, the above process is specifically described with specific numerical values. Although various elements are contained in the intercell connection information 51, it is assumed herein that two elements shown in FIGS. 16A and 16B are input to the intercell connection information 51. Further, information about these two elements are contained in the soft library 57.

Figure 17:
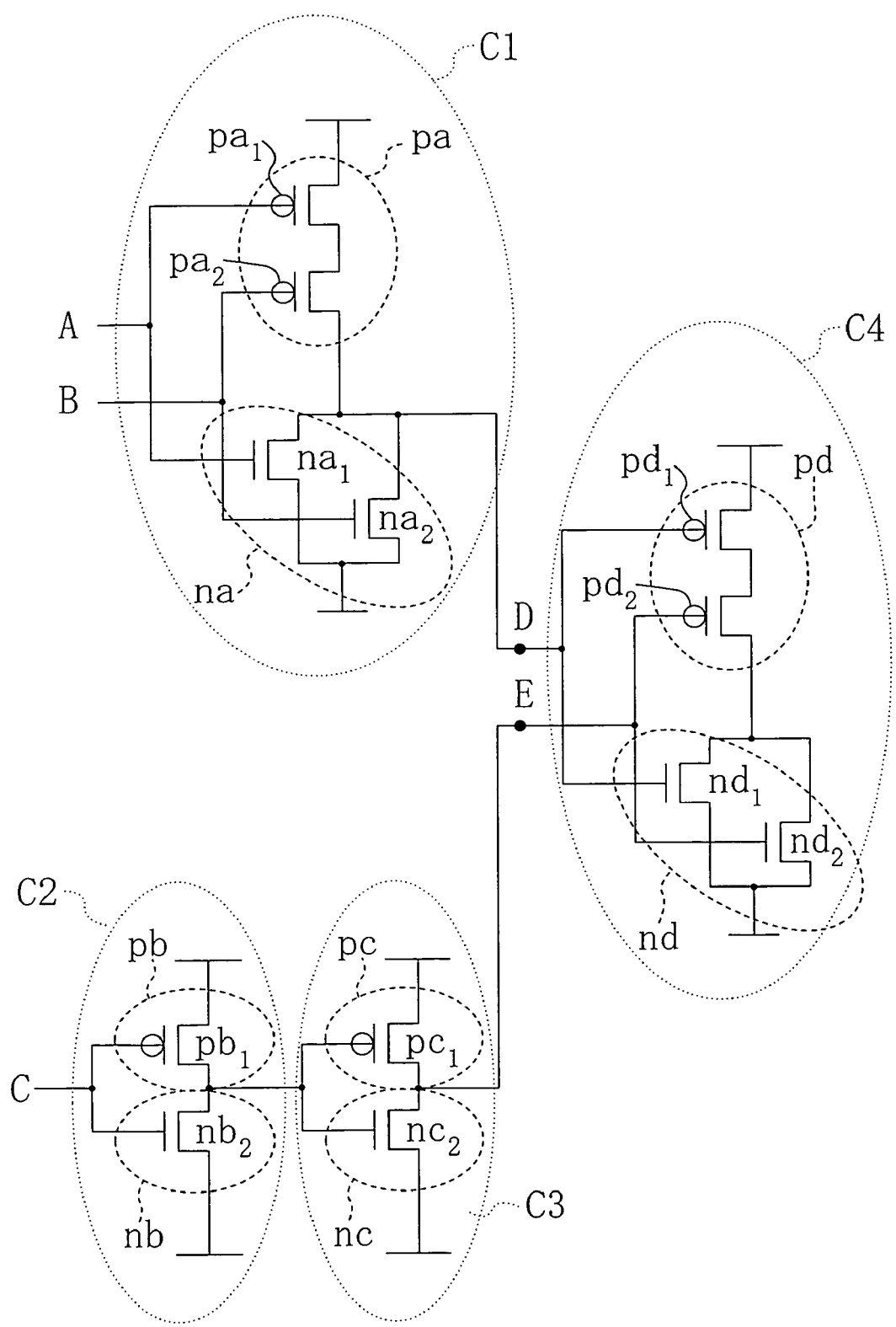
FIG. 17 shows an example of a circuit design of the element of FIG. 16A.

First, the element shown in FIG. 16A is described. FIG. 17 shows an example of a circuit design of the element of FIG. 16A. A method for calculating the gate width is described with reference to FIG. 17. Herein, it is assumed for convenience of illustration that the gate width of a P-channel transistor is 6, and the gate width of a N-channel transistor is 2. At the first step, a cell is divided into gate rows (C1 to C4). In the gate rows, the gate width of transistors is calculated for every channel type. Specifically, the average value is calculated in the case of a serial connection and, alternatively, the sum is calculated in the case of a parallel connection, whereby the gate width of the P-channel transistor and the gate width of the N-channel transistor are determined. Thereafter, the average value of the gate width of the P-channel transistor and the gate width of the N-channel transistor is regarded as the gate width of one gate row. The average value of the gate widths of the gate rows is regarded as the gate width of the cell, i.e., the gate width statistical information.

In the case of gate row C1, the P-channel gate width is (6+6)/2=6, and the N-channel gate width is 6+6=12. Thus, the gate width of gate row C1 is (6+12)/2=9. In the same way, both the gate widths of gate rows C2 and C3 are 4, and the gate width of gate row C4 is 9. Therefore, the average value of the gate widths of all the gate rows C1 to C4 is (9+4+4+9)/4=6.5, which is the gate width statistical information.

The serial coefficient is now described. The serial coefficient indicates the number of serially-connected transistors. In the example of FIG. 17, the serial coefficient of P-channel portions pa and pd is 2, and the serial coefficient of P-channel portions pb and pc is 1. The serial coefficient of N-channel portions na, nb, nc and nd is 1. The P-channel portion serial coefficient is the average of the serial coefficients of the P-channel portions, which is (2+2+1+1)/4=1.5. The N-channel portion serial coefficient is the average of the serial coefficients of the N-channel portions, which is (1+1+1+1)/4=1.0. The sum of the P-channel portion serial coefficient and the N-channel portion serial coefficient, i.e., 1.5+1.0=2.5, is the intracell serial statistical information.

The multi-stage cell coefficient is the number of gate stages included in a cell. In the example of FIG. 17, the multi-stage cell coefficient is 4. Thus, as for the element of FIG. 16A, "6.5" as the gate width statistical information 53, "2.5" as the intracell serial coefficient statistical information 54, and "4" as the multi-stage cell coefficient information 55 are stored in the soft library 57.

Next, the input state probability is described. In the circuit of FIG. 17, there are three information inlets A, B and C. Further, two information inlets D and E exist behind the gate rows C1, C2 and C3. The value of "0" or "1" is input to the information inlets A, B and C, and therefore, there is 8 different combinations of the inputs as shown in FIG. 18. If "0" is input to a P-channel transistor, the P-channel transistor constitutes ON-resistance to output "1". If "1" is input to a P-channel transistor, the P-channel transistor constitutes OFF-resistance to output no value. If "0" is input to a N-channel transistor, the N-channel transistor constitutes OFF-resistance to output no value. If "1" is input to a N-channel transistor, the N-channel transistor constitutes ON-resistance to output "0". The operations of the gate rows in accordance with this rule for the combinations of the inputs to the information inlets A, B and C are described below.

It is seen from FIG. 18 whether each transistor constitutes ON-resistance or OFF-resistance in each combination of inputs. In the case of a series connection, when at least one OFF-resistance is included in the series connection, the series connection constitutes OFF-resistance. Only when all of the resistances are ON-resistances, the series connection constitutes ON-resistance. In the case of a parallel connection, this rule is inverted. Specifically, in the case of a parallel connection, when at least one ON-resistance is included in the parallel connection, the parallel connection constitutes ON-resistance. Only when all of the resistances are OFF-resistances, the parallel connection constitutes OFF-resistance.

As for the P-channel portion pa, among the 8 combinations of the inputs to the information inlets A, B and C, the combinations of (0, 0, 0) and (0, 0, 1) cause the P-channel portion pa to constitute ON-resistance. Thus, the probability that the P-channel portion pa is turned ON is ¼. In the same way, the probability that each of the P-channel portions pb and pc and the N-channel portions na, nb and nc is turned ON can be determined.

Accordingly, the state of the information inlets D and E are also determined as shown in FIG. 18 from the above-described characteristics of the P-channel transistors and N-channel transistors. Therefore, the probability that the P-channel portion pd and the N-channel portion nd are each turned ON can be determined from the state probability of the information inlets D and E.

The P-channel portion input state probability is the average of the ON probability of the P-channel portions pa, pb, pc and pd, i.e., (¼+½+½+⅜)/4=13/32. The N-channel portion input state probability is the average of the ON probability of the N-channel portions na, nb, nc and nd, i.e., (¾+½+½+⅝)/4=19/32. The input state probability of the cell of FIG. 16A is the average of the P-channel portion input state probability and the N-channel portion input state probability, i.e., (13/32+19/32)/2=0.5. It should be noted that, in the case of a so-called CMOS logic circuit, the input state probability of a cell is 0.5. Herein, we dared to determine this value by calculation for description.

Next, the ON-resistance value is described. In the example of embodiment 1, it is assumed that the unit ON-resistance values of the P-channel transistor and the N-channel transistor are equal. When a voltage of 1.5 V is applied between the drain and the source of the P-channel transistor or N-channel transistor having a gate width of 1 μm, and the electric current flowing from the source to the drain is 0.2 A, ON-resistance value Ron for the gate width of 1 μm is:

$$Ron = 1.5\ V/0.2\ A = 7.5\ \Omega$$

The P-channel portion ON-resistance is 7.5 Ω, and the N-channel portion ON-resistance is 7.5 Ω. The ON-resistance value is the average of the P-channel portion ON-resistance and the N-channel portion ON-resistance, i.e., 7.5 Ω.

Specific cell resistance component calculation process S32 is performed using the above values to determine specific cell resistance value c:

$$c = (\alpha \times \gamma \times a \times w/b)/\beta$$
$$= (0.5 \times 2.5 \times 7.5 \times 1/6.5)/4$$
$$= 0.36 \, \Omega$$

This is the specific cell resistance value 61 of the element of FIG. 16A.

Next, the element of FIG. 16B is described. The element of FIG. 16B is a so-called inverter. When value "1" is input to an input terminal I, the inverter INV outputs value "0". When value "0" is input to the input terminal I, the inverter INV outputs value "1". That is, the specifications of the inverter INV are such that the input information is inverted.

Figure 19:
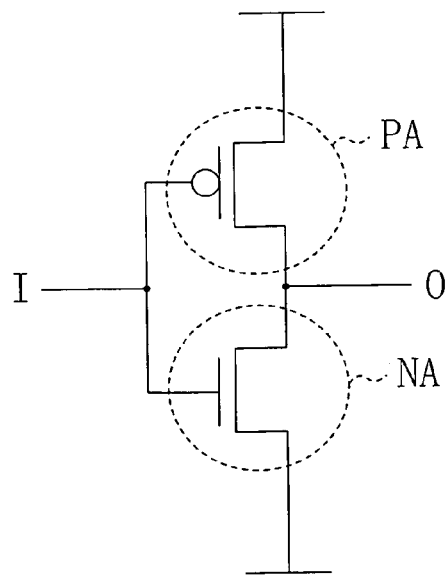
FIG. 19 shows an example of a circuit design of the element of FIG. 16B.

FIG. 19 shows an example of a circuit design of the inverter at this specification level. Herein, it is assumed for convenience of illustration that the gate width of a P-channel transistor is 6, and the gate width of a N-channel transistor is 2. The average of these gate widths, i.e., (2+6)/2=4, is the gate width statistical information. Since the P-channel portion serial coefficient is 1 and the N-channel portion serial coefficient is 1, the sum of these value, i.e., 1+1=2, is the intracell serial statistical information. The multi-stage cell statistical information is 1.

Then, the input state probability is determined. In the same way as that described as to the device of FIG. 16A, the P-channel portion input state probability is determined to be ½, and the N-channel portion input state probability is determined to be ½. Thus, the input state probability is determined as follows:

$$\{(½+½)/2\} = 0.5$$

Assuming that the same production process and the same type of transistors of the device of FIG. 16A are employed, the ON-resistance value is also the same value, i.e., 7.5 Ω.

From the above values, value c is calculated as follows:

$$c = (\alpha \times \gamma \times a \times w/b)/\beta$$
$$= (0.5 \times 2 \times 7.5 \times 1/4)/4$$
$$= 0.47 \, \Omega$$

Thus, the specific cell resistance of the inverter of FIG. 19 is determined to be 0.47 Ω.

As a result, the resistance value of the element of FIG. 16A and the resistance value of the inverter of FIG. 16B are determined.

Next, in the example of FIG. 12, it is assumed that the specific cell number 58 has the information that one element of FIG. 16A and one inverter of FIG. 16B are used. Calculation is performed through all-cell resistance component parallel merge process S34 on the assumption that the element of FIG. 16A and the inverter of FIG. 16B are connected in parallel:

$$1/(1/0.36 + 1/0.47) = 0.20$$

That is, MOS resistance Rmos is 0.20 Ω.

As a result of the above processes, line resistance Rline is 0.74 Ω, decoupling capacitance resistance Rcap is 1.0 Ω, and MOS resistance Rmos is 0.20 Ω. Thus, expression (1) is calculated as follows:

$$Ri = 0.74 + 1/(1/1.0 + 1/0.2)$$
$$= 0.91 \, \Omega$$

As described above, according to embodiment 1, the resistance values of at least two power supply lines, the resistance value of a decoupling capacitor, and the resistance value of a transistor are separately calculated, whereby the resistance value inside a semiconductor integrated circuit, which is the sum of the calculated resistance values, is determined with high accuracy within a short time period.

Embodiment 2

In embodiment 2, the process in the line resistance calculation section 32, i.e., the method for determining the line resistance, is different from that of embodiment 1. In embodiment 2, the supply line resistance is determined from the average value of voltage drops in power supply lines which are caused by a current flow through a cell and the total electric currents flowing through respective cells. The other features are basically the same as those of embodiment 1 except where specifically noted.

The concept of the process of embodiment 2 is as shown in FIG. 7. Electric current I which flows through power supply resistance Rpower is the sum of electric currents flowing into all the cells, Icell, which is readily determined from electric current information of respective cells input into an IR-Drop simulation. Potential difference ΔV between external terminal VDD and a cell is the difference between supply voltage V0 input into the IR-Drop simulation and average value V1 of voltage drop values of respective cells which are determined as a result of the IR-Drop simulation. In this case, power supply resistance Rpower can be determined from potential difference ΔV and value I by the following expression:

$$Rpower = \Delta V/I$$

Figure 20:
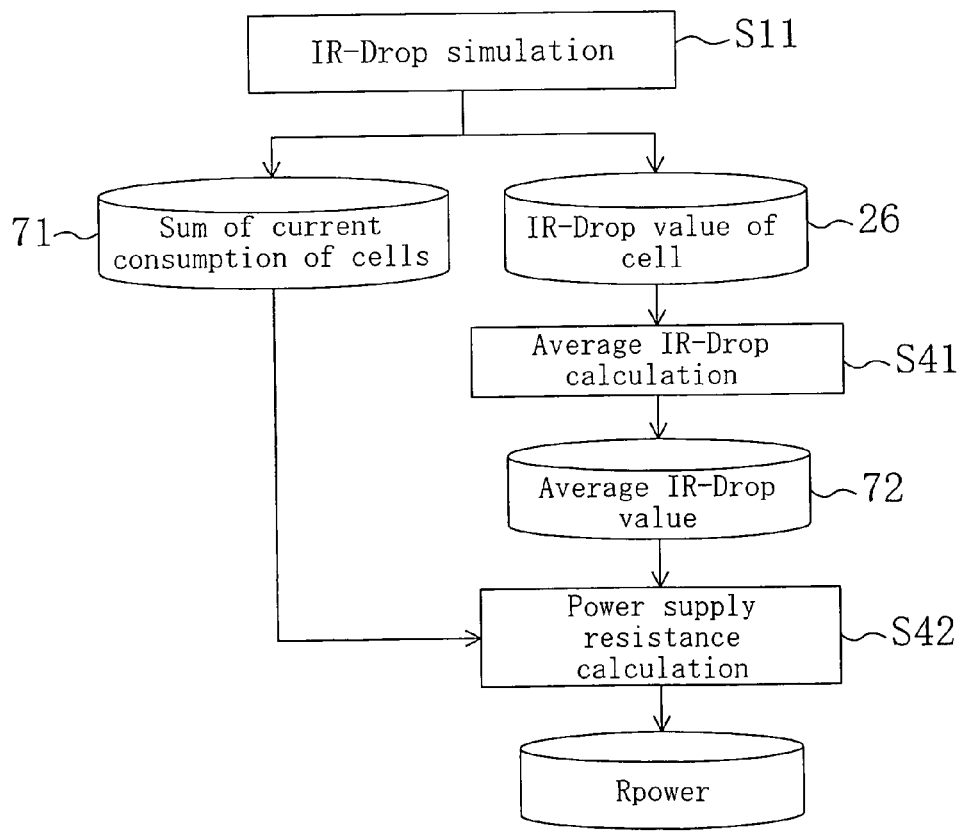
FIG. 20 illustrates the process of embodiment 2 of the present invention.

FIG. 20 illustrates the process of embodiment 2. As shown in FIG. 20, a voltage drop value 26 which is caused in a power supply line by a current flow through each cell is determined by IR-Drop simulation S11. The average value of the voltage drop value 26 (average IR-Drop value 72) is determined by average IR-Drop calculation process S41. Then, resistance value Rpower is determined from the sum of current consumption in the cells (sum 71) and the average IR-Drop value 72 by power supply resistance calculation process S42.

Next, the above process is described with specific values. In the example of FIG. 8, assuming that the electric currents flowing through the cells 25a to 25c are 100 mA, 120 mA and 100 mA, respectively, and the voltages of the cells 25a to 25c are 1.39 V, 1.375 V and 1.35 V, respectively, the average IR-Drop value 72 is:

$$1.5 - (1.39 + 1.375 + 1.35)/3 = 0.13 \, V$$

The sum 71 of the electric currents flowing through the cells 25a to 25c is:

$$100 + 120 + 100 = 320 \, mA$$

Thus, power supply resistance Rpower is:

$$Rpower = \Delta V/I$$
$$= 0.13/0.32$$
$$= 0.41 \, \Omega$$

As a matter of course, ground resistance Rground can be determined in the same way.

According to embodiment 2, the line resistance can be determined within a short time period by using the average value of dropped voltages in power supply lines, which are caused by the current flow through cells, and the sum of cell currents.

Embodiment 3

In embodiment 3 of the present invention, a method for calculating the decoupling capacitance resistance is different from that described above in embodiment 1. In embodiment 3, the resistance is determined without modeling of a cell. The other features are basically the same as those of embodiment 1 except where specifically noted.

Figure 21:
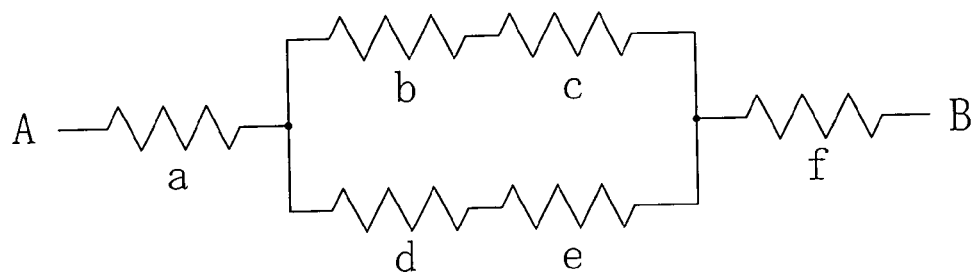
FIG. 21 illustrates a circuit model used for explaining the reduction process of embodiment 3 of the present invention.

In the example of FIG. 9, only the resistance values are extracted from a post layout netlist 42 which has undergone LPE process S21 to perform reduction. Now, consider a circuit shown in FIG. 21. The resistance value between terminals A and B is calculated by the following expression:

$$a+1/(1/(b+c)+1/(d+e))+f$$

That is, one resistance value can be obtained by the reduction. Assuming that resistance values a to f are 1 Ω, 2 Ω, 2 Ω, 1 Ω, 3 Ω, 3 Ω, respectively, the resistance value between terminals A and B is 6 Ω according to the above expression. Therefore, decoupling capacitance resistance Rcap is 6 Ω.

According to embodiment 3, the resistance value can be determined even when there is a CAP formed by the decoupling capacitance which is not modeled in advance.

Embodiment 4

In embodiment 4, a method for calculating the decoupling capacitance resistance is different from that described above in embodiment 1. In embodiment 4, the number of capacity cells is calculated from the area occupied by the capacity cells, and the decoupling capacitance resistance is calculated on the assumption that the capacity cells are connected in parallel. The other features are basically the same as those of embodiment 1 except where specifically noted.

Figure 22:
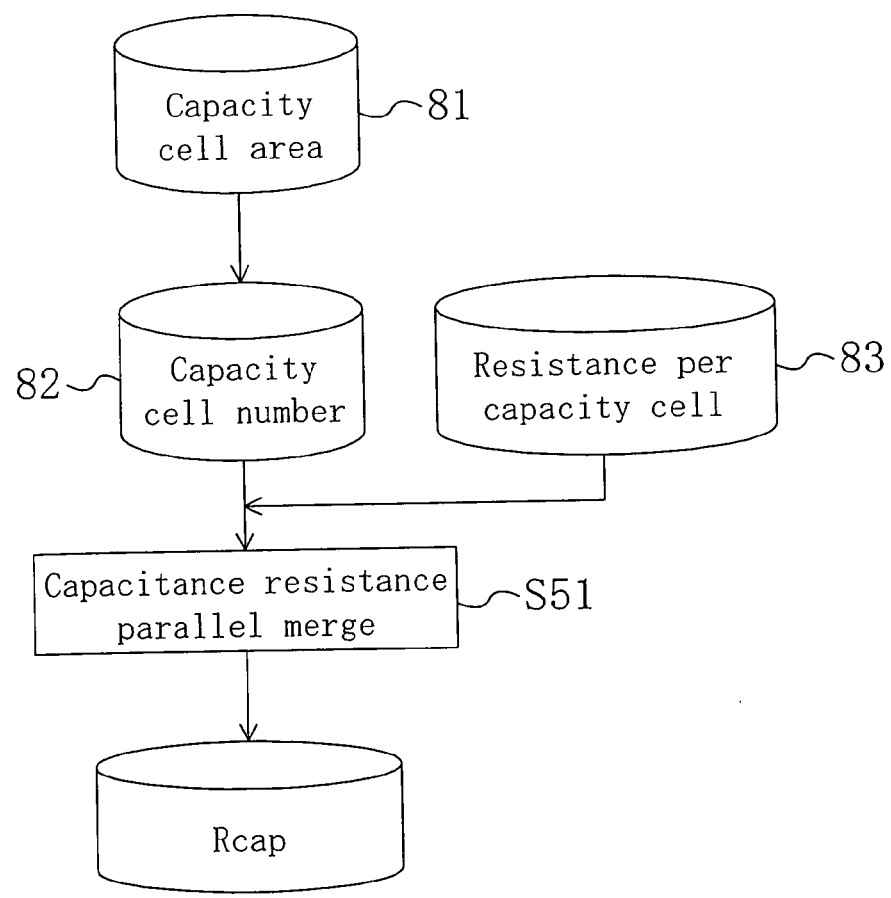
FIG. 22 illustrates the process of embodiment 4 of the present invention.

FIG. 22 illustrates the operation of the decoupling capacitance resistance calculation means according to embodiment 4. As shown in FIG. 22, the number of capacity cells (capacity cell number 82) is calculated from the area of the capacity cells (capacity cell area 81), and capacitance resistance parallel merge process S51 is performed on the assumption that the calculated number of capacity cells are connected in parallel. Since the capacity cells are generally arranged in parallel, the resistances of the capacity cells also have a relationship of parallel connection. Therefore, capacitance resistance parallel merge process S51 only includes the process of adding the resistances per capacity cell 83 in parallel the number of times corresponding to the capacity cell number 82. Thus, decoupling capacitance resistance Rcap can be calculated in an instant with a simple arithmetic operation.

Figure 23:
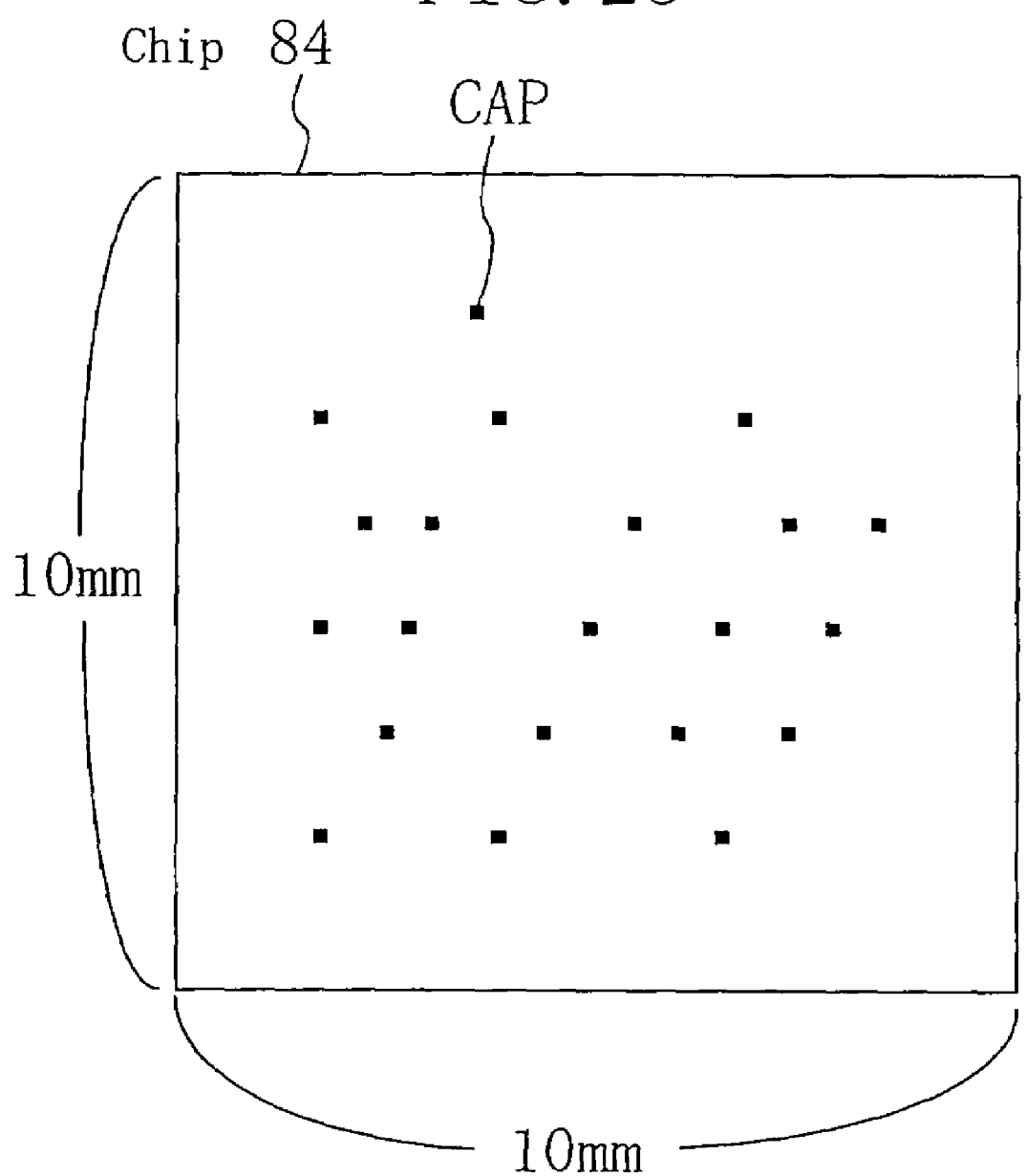
FIG. 23 shows a chip over which CAPs are distributed.

The above process is described with specific values. Now, consider a case where there is a chip 84 of 10 mm×10 mm as shown in FIG. 23. Since one side is 10 mm, the area of the chip 84 is 100 mm². Dots distributed over the chip 84 indicate CAPs. It is assumed that the area of one CAP is 0.01 mm², and the resistance value is 2 Ω. Herein, the number of CAPs present in the chip 84 is determined using an area calculation tool. Assuming that the areas of all the CAPs are added together by the area calculation tool and the total CAP area is 1 mm², the number of CAPs present in the chip 84 is determined to be 100. Thus, in the example of FIG. 22, the capacity cell number 82 is 100, and the resistance per capacity cell 83 is 2 Ω. Accordingly, decoupling capacitance resistance Rcap is determined to be 0.02 Ω by capacitance resistance parallel merge process S51.

The decoupling capacitor device is inserted for the purpose of noise reduction, etc. In embodiment 4, the resistance value can be calculated, as well as the capacitance value, using the number of inserted devices and the area occupied by the inserted devices as parameters. Thus, an optimum number of decoupling capacitors can be inserted at the design stage.

It should be noted that, in the case of determining the decoupling capacitance resistance with high accuracy, it is desirable to sort the number or area of the capacity cells and the resistance value per capacity cell in the form of a library by the type of capacity cells. On the other hand, for the purpose of simple calculation, it is preferable to use the total number or total area of capacity cells and a constant resistance value irrespective of the type of capacity cells.

Embodiment 5

Embodiment 5 of the present invention is different from embodiments 1 and 2 in that a cell is not specified in the process of determining the cell resistance. The other features are basically the same as those of embodiment 1 except where specifically noted.

Figure 24:
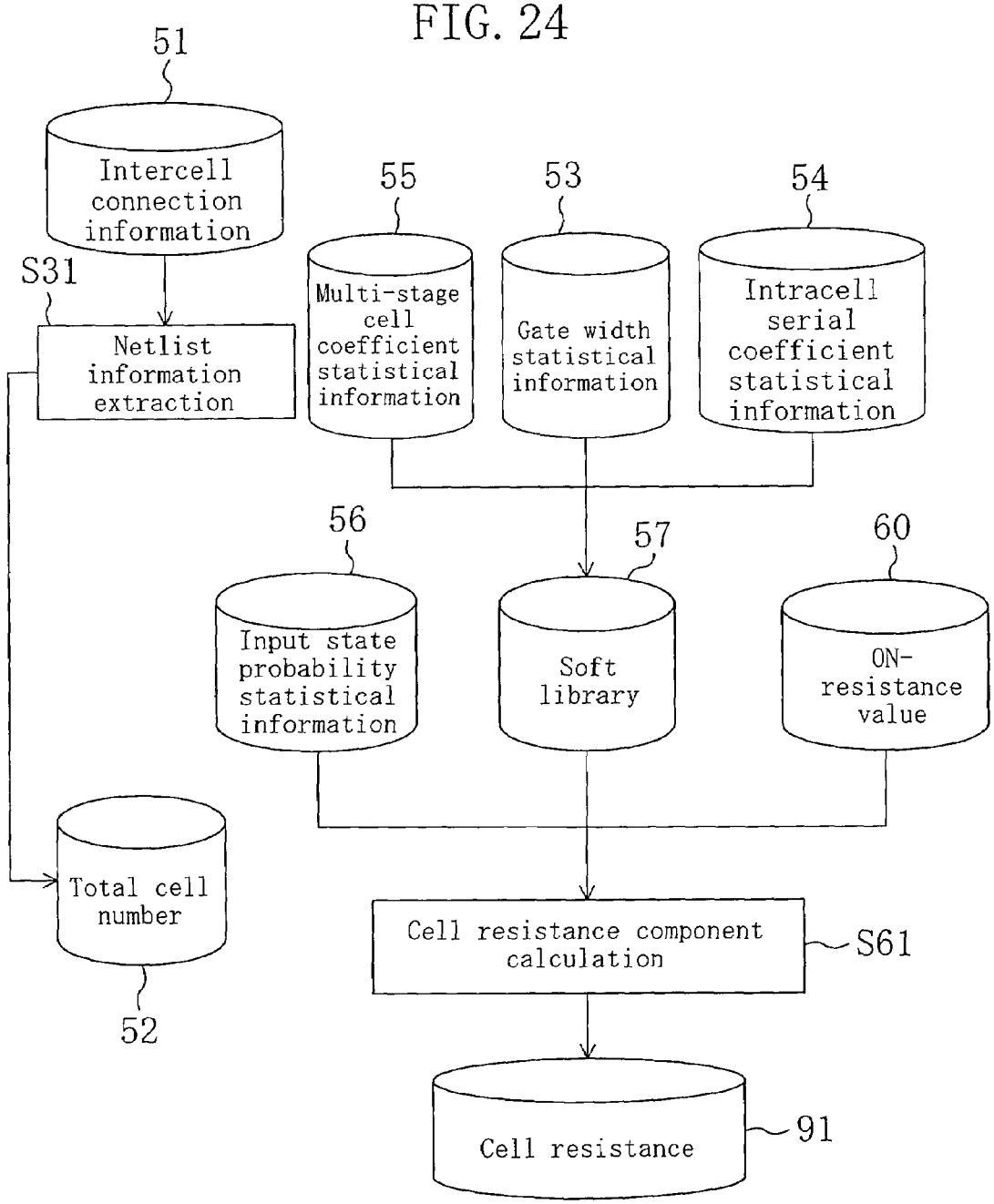
FIG. 24 illustrates the process of embodiment 5 of the present invention.
Figure 25:
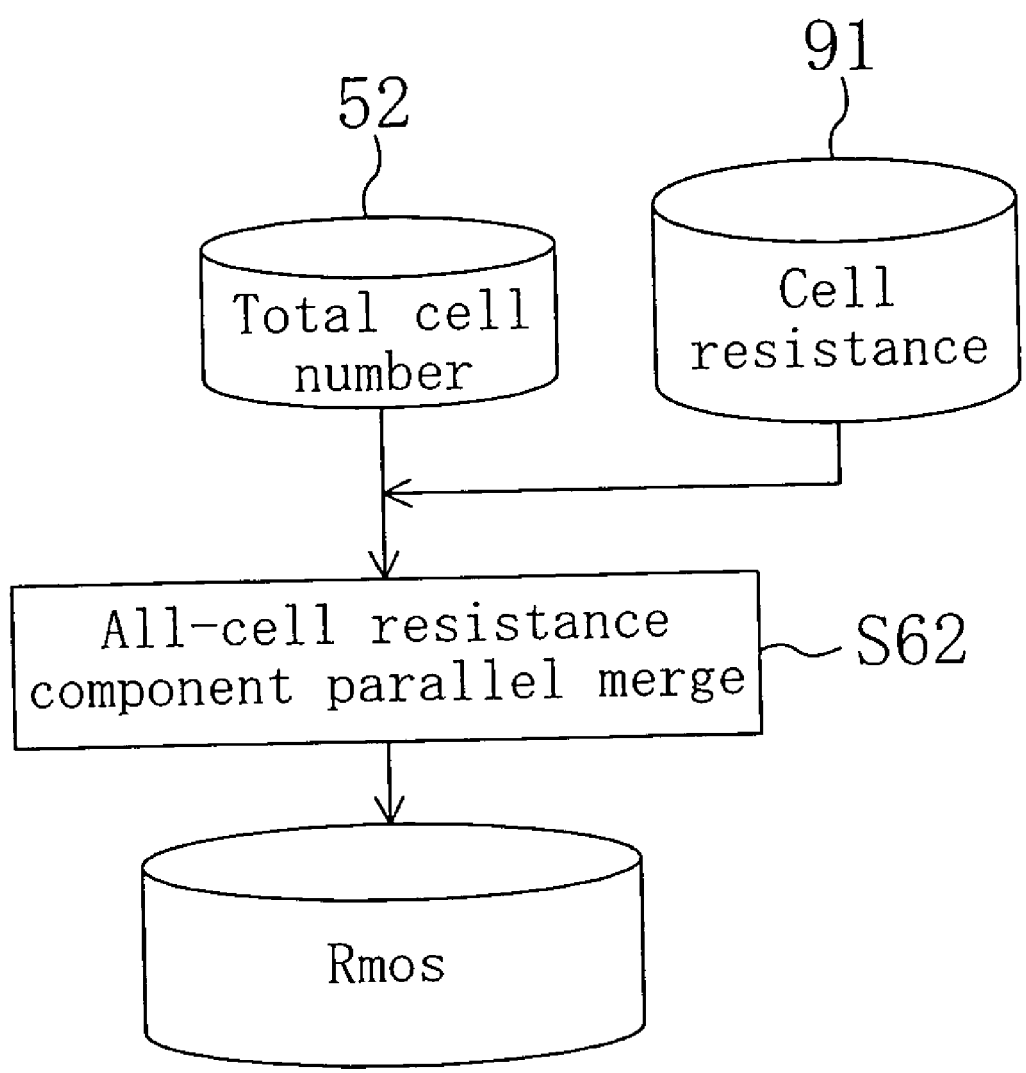
FIG. 25 illustrates the process of embodiment 5 of the present invention.

FIGS. 24 and 25 illustrate the operation of the MOS resistance calculation section 34 according to embodiment 5. The operation of embodiment 5 is different from that illustrated in FIGS. 11 and 12 of embodiment 1 in that the specific cell number 58 is not determined. In cell resistance component calculation process S61, the resistance value of a cell is obtained only for one cell type as a cell resistance 91. Then, in all-cell resistance component parallel merge process S62, MOS resistance Rmos is determined on the assumption that a number of cells having the cell resistance 91 which corresponds to the total cell number 52 are connected in parallel.

It should be noted that the cell resistance 91 may be selected from the soft library 57 by user's decision. Alternatively, information about the cell resistance 91 may be contained in the intercell connection information 51.

According to embodiment 5, the calculation amount is smaller than that of embodiment 1. Thus, the resistance value can be calculated within a shorter time period.

Embodiment 6

Embodiment 6 of the present invention is different from embodiment 1 in that a hard library is used in the process of determining the specific cell resistance 61. The other features are basically the same as those of embodiment 1 except where specifically noted.

Figure 26:
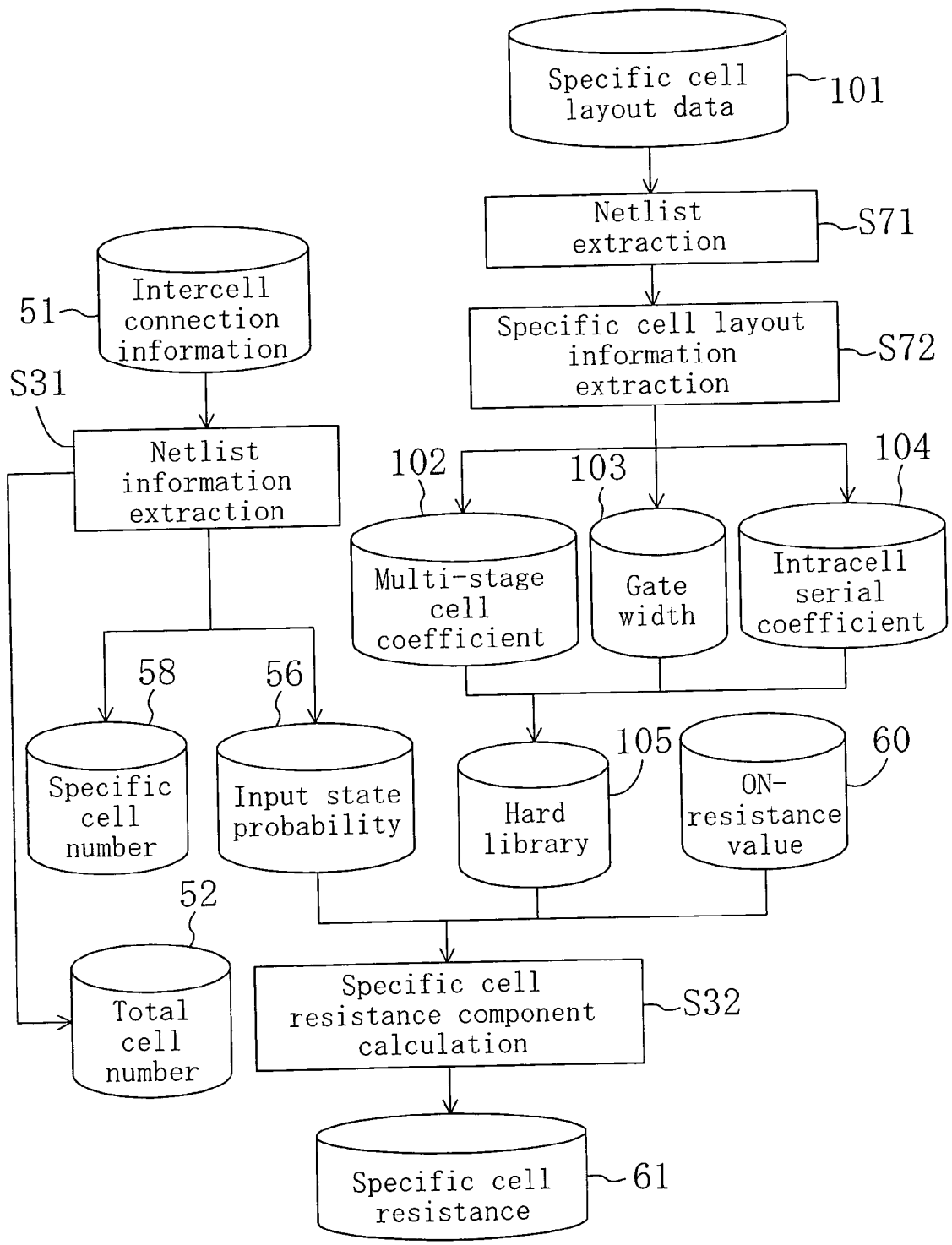
FIG. 26 illustrates the process of embodiment 6 of the present invention.

FIG. 26 illustrates the operation of the MOS resistance calculation section 34 according to embodiment 6, which is a variation of the example of FIG. 11 illustrated above in embodiment 1. In FIG. 26, in netlist extraction process S71, layout information of a specific cell is extracted from mask layout information 101 provided for each type of the specific cell. Then, in specific cell layout information extraction process S72, a multi-stage cell coefficient 102, a gate width 103, and an intracell serial coefficient 104 are extracted for each type of the specific cells and stored in advance in a hard library 105.

In specific cell resistance component calculation process S32, the specific cell resistance value 61 is calculated using the input state probability 56, hard library 105, and ON-resistance value 60 of a specific cell used in a semiconductor integrated circuit. The multi-stage cell coefficient 102, a gate width 103, and an intracell serial coefficient 104 are selected for each type of the cells from the hard library 105. This process is repeated the number of times corresponding to the types of specific cells.

Next, as in the example of FIG. 12, in specific cell resistance component parallel merge process S33, the synthesized resistance of specific cells is calculated using the specific cell resistance value 61 and the specific cell number 58. Then, in all-cell resistance component parallel merge process S34, MOS resistance Rmos is calculated using the synthesized resistance and the total cell number 52 of specific cells.

The method of embodiment 6 is applicable even after a layout is completed and achieves calculation of MOS resistance with higher accuracy.

Embodiment 7

Embodiment 7 of the present invention is different from embodiment 1 in that the MOS resistance is estimated in the transistor level designing stage. The other features are basically the same as those of embodiment 1 except where specifically noted. Calculation of the line resistance and the decoupling capacitance resistance is the same as that described in embodiment 1.

Figure 27:
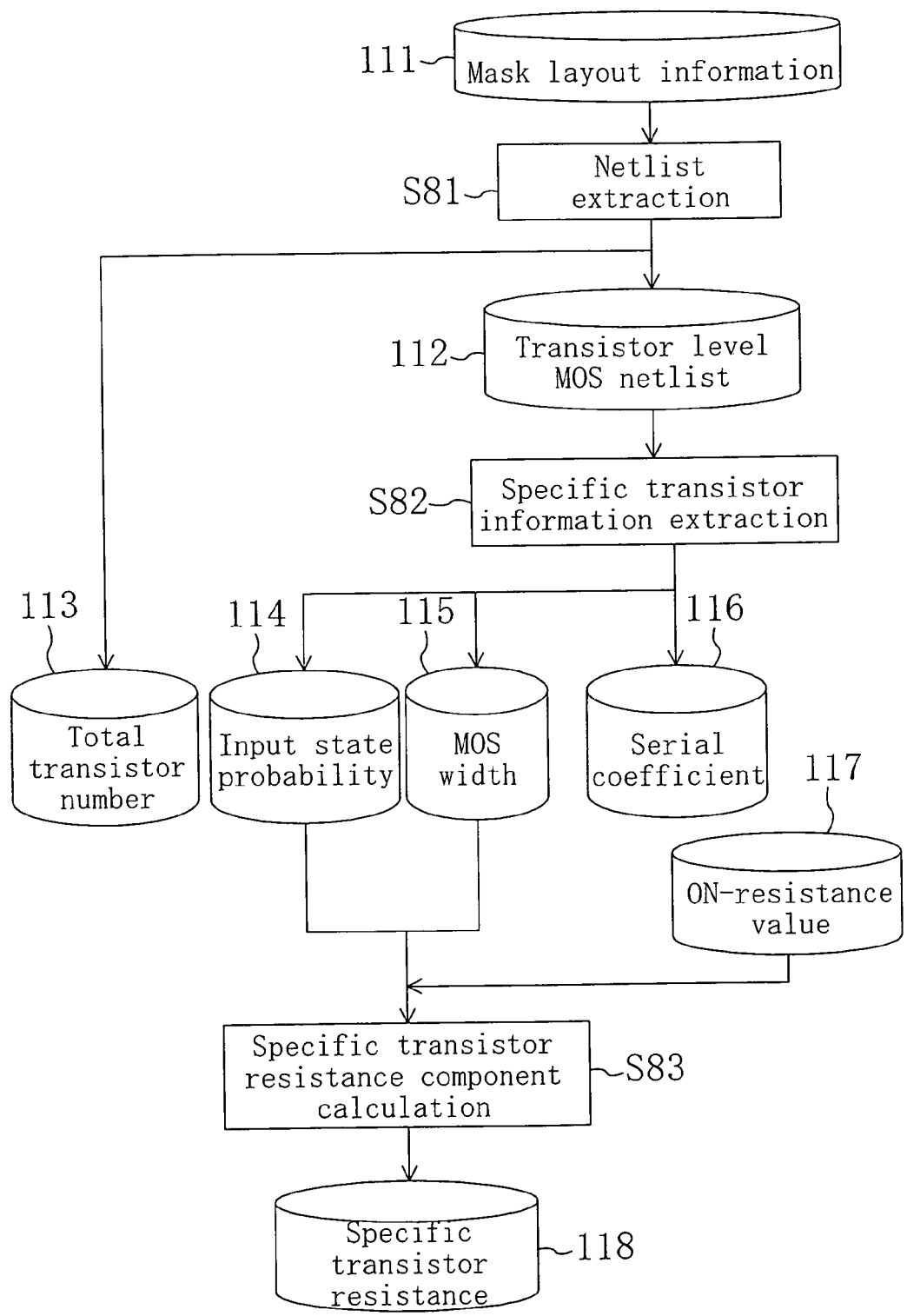
FIG. 27 illustrates the process of embodiment 7 of the present invention.
Figure 28:
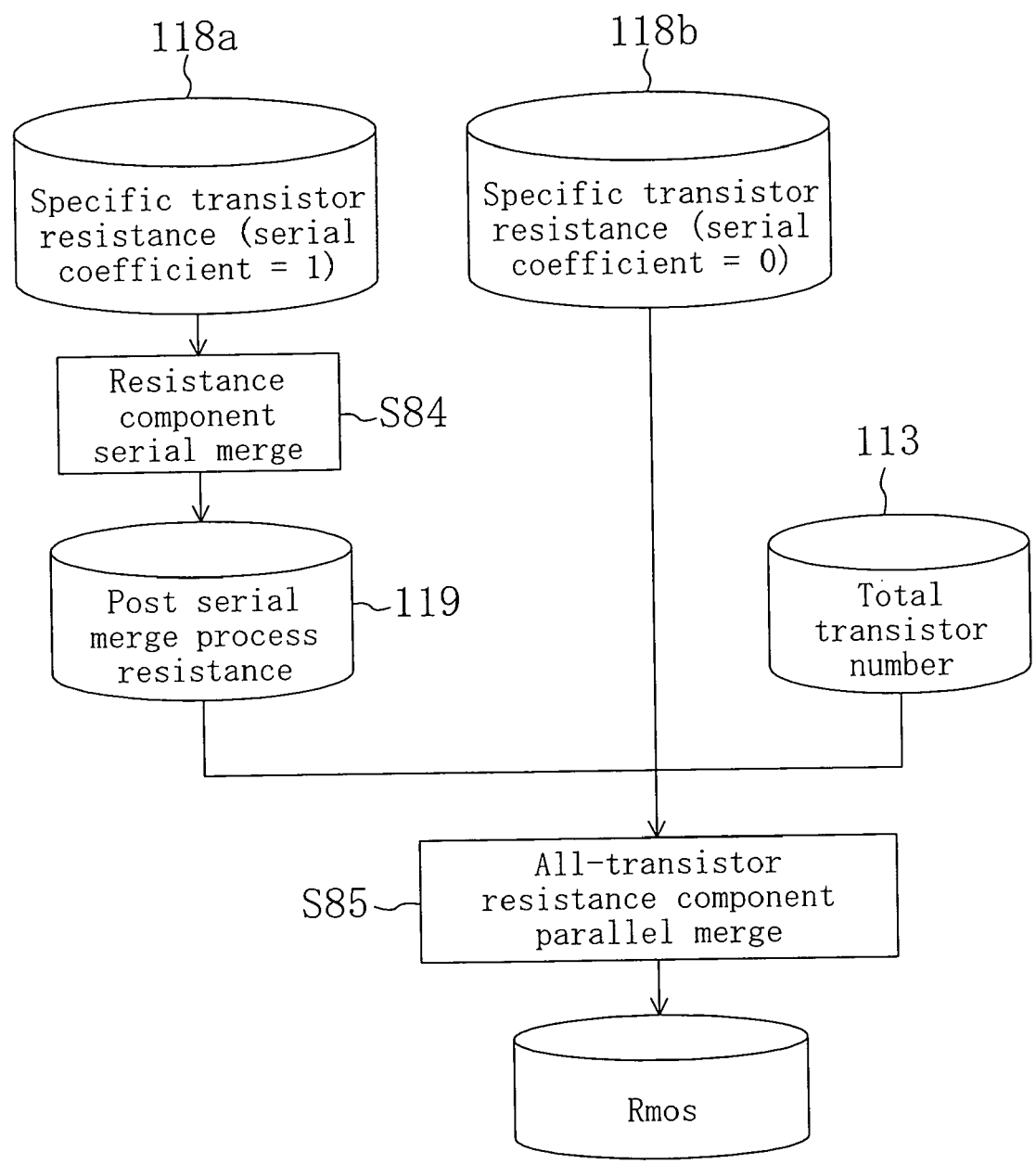
FIG. 28 illustrates the process of embodiment 7 of the present invention.

FIGS. 27 and 28 illustrate the operation of the MOS resistance calculation section 34 according to embodiment 7. In this example, a transistor-level netlist including resistances is extracted from a layout and, then, the input state probability, the parallel/serial connection state, and the MOS width are extracted from the netlist for each transistor (MOS). Further, the resistance determined by the process is used together to calculate the MOS resistance for each transistor.

At the first step, layout information is read from mask layout information 111, and then, netlist extraction process S81 is performed to extract a transistor level MOS netlist 112 and the total number of transistors (total transistor number 113). In netlist extraction process S81, a general LPE (Layout Parasitic Extraction) tool is used.

In specific transistor information extraction process S82, an input state probability 114, a MOS width 115, and a serial coefficient 116 are obtained from the transistor level MOS netlist 112. The input state probability is calculated using a probability propagation method, such as that used in a simulator. The serial coefficient 116 is a coefficient indicative of whether transistors are connected in parallel ("1") or not ("0").

Then, in specific transistor resistance component calculation process S83, a specific transistor resistance 118 is determined from the input state probability 114, the MOS width 115 and an ON-resistance value 117. Specifically, the resistance values of MOS widths corresponding to the serial coefficients "0" and "1" are determined from the MOS width 115 using the ON-resistance value 117. The determined resistance values are multiplied by the input state probability 114 for a case where the transistor is turned ON, whereby effective resistance values are obtained.

As shown in FIG. 28, the specific transistor resistance 118 is classified, in conjunction with the serial coefficient 116, into a first specific transistor resistance 118a corresponding to serial coefficient "1" and a second specific transistor resistance 118b corresponding to serial coefficient "0". In resistance component serial merge process S84, the resistance after the serial merge process (post serial merge process resistance 119) is determined from the first specific transistor resistance 118a.

Then, in all-transistor resistance component parallel merge process S85, MOS resistance Rmos is determined from the second specific transistor resistance 118b, the post serial merge process resistance 119 and the total transistor number 113.

In embodiment 7, the resistance is calculated for each transistor, and therefore, the MOS resistance can be calculated with high accuracy. Further, the serial merge process and the parallel merge process are separately performed. Thus, high speed processing is realized using simple arithmetic operations without performing an operation for a complicated resistance network with a reduction tool.

Embodiment 8

Embodiment 8 of the present invention is different from embodiment 1 in that a transistor-level netlist including resistances is extracted from a layout, a MOS transistor is replaced by a resistive element, and the MOS resistance is determined from the power consumption or current consumed when a voltage is applied. The other features are basically the same as those of embodiment 1 except where specifically noted.

Figure 29:
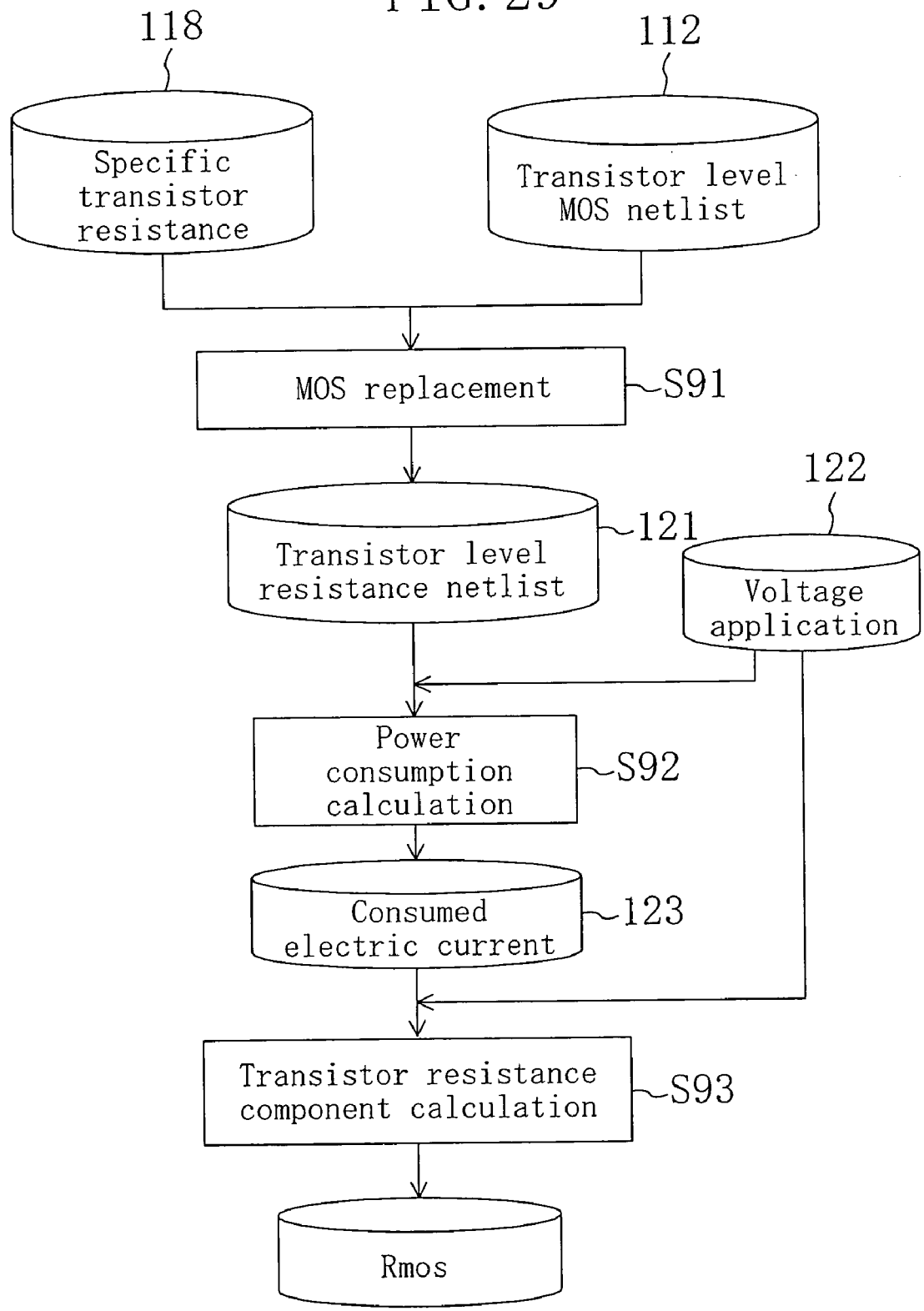
FIG. 29 illustrates the process of embodiment 8 of the present invention.

The operation of the MOS resistance calculation section 34 of embodiment 8 is described with reference to FIGS. 27 and 29. At the first step, as shown in FIG. 27, the specific transistor resistance 118 and the transistor level MOS netlist 112 are determined as described in embodiment 7. Then, as shown in FIG. 29, in MOS replacement process S91, a transistor level resistance netlist 121 formed only by resistances is generated from the specific transistor resistance 118 and the transistor level MOS netlist 112. Specifically, a specific transistor in the transistor level MOS netlist 112 is replaced by a resistive element corresponding to the specific transistor.

Then, in power consumption calculation process S92, a consumed electric current 123 is determined from voltage application information 122 and the transistor level resistance netlist 121. Specifically, the consumed electric current 123 is calculated by executing a simulator, such as a SPICE, or the like. Next, in transistor resistance component calculation process S93, MOS resistance Rmos is determined from the voltage application information 122 and the consumed electric current 123. Specifically, MOS resistance Rmos is calculated by dividing the voltage application information 122 by the consumed electric current 123.

According to embodiment 8, the Kirchhoff's laws are used, and therefore, the MOS resistance can be calculated with higher speed. Further, in the case of a special layout having a structure which cannot be simplified only into the serial merge process and parallel merge process, the MOS resistance can be calculated with high speed.

Embodiment 9

Embodiment 9 of the present invention is different from embodiment 1 in that the MOS resistance and the total number of transistors are determined for several layouts to generate statistical information of correlation between the number of transistors and the MOS resistance, and MOS resistance Rmos of a new layout is determined from the number of transistors based on the statistical information. The other features are basically the same as those of embodiment 1 except where specifically noted.

Figure 30:
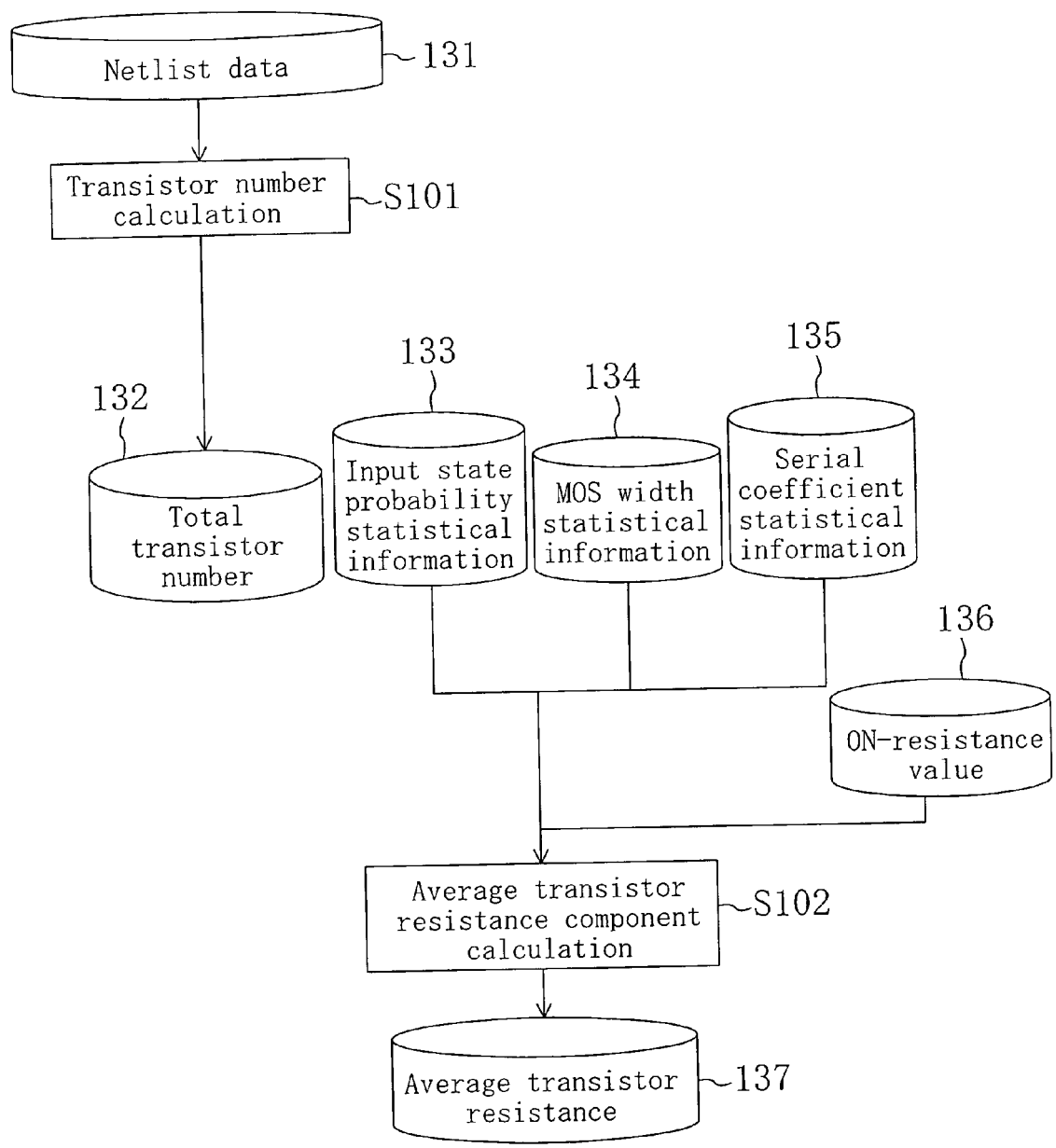
FIG. 30 illustrates the process of embodiment 9 of the present invention.
Figure 31:
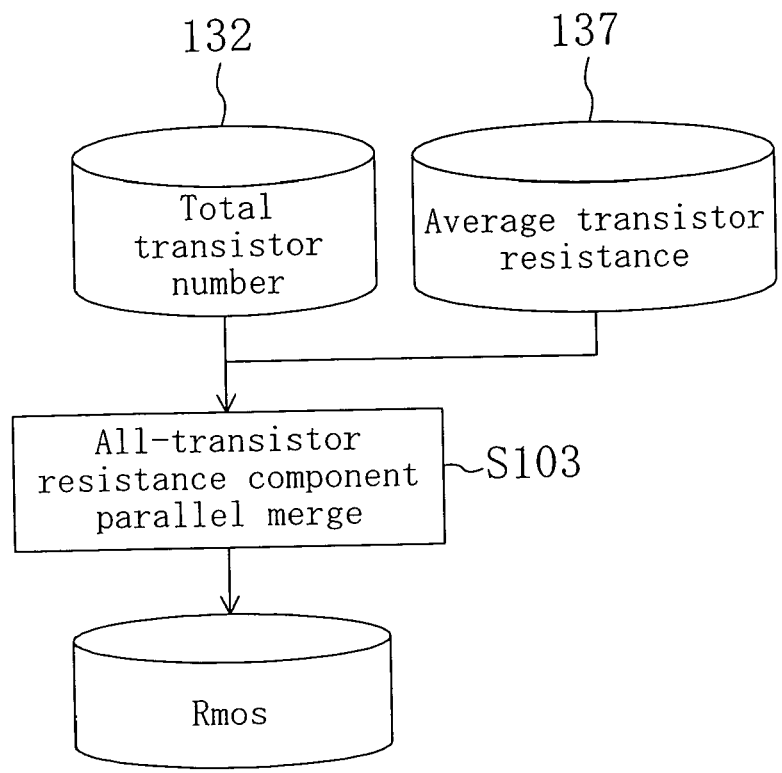
FIG. 31 illustrates the process of embodiment 9 of the present invention.

FIGS. 30 and 31 illustrates the operation of the MOS resistance calculation section 34 of embodiment 9. As shown in FIG. 30, in transistor number calculation process S101, the total number of transistors (total transistor number 132) is calculated from gate-level or transistor-level netlist data 131. In the meantime, in average transistor resistance component calculation process S102, an average transistor resistance 137 is determined in advance from input state probability statistical information 133, MOS width statistical information 134, serial coefficient statistical information 135 and ON-resistance value 136 which are calculated for several layouts.

Then, as shown in FIG. 31, in all-transistor resistance component parallel merge process S103, the average transistor resistance 137 is multiplied by the total transistor number 132 to determine MOS resistance Rmos.

According to embodiment 9, calculation of the MOS resistance can be performed before the completion of layout. Thus, a feedback to a design is readily achieved.

Embodiment 10

Embodiment 10 of the present invention is directed to a hierarchical resistance estimation method and is characterized in that the resistance estimation method of embodiment 1 illustrated in FIG. 4 is applied to a hierarchical block in an LSI circuit.

Figure 32:
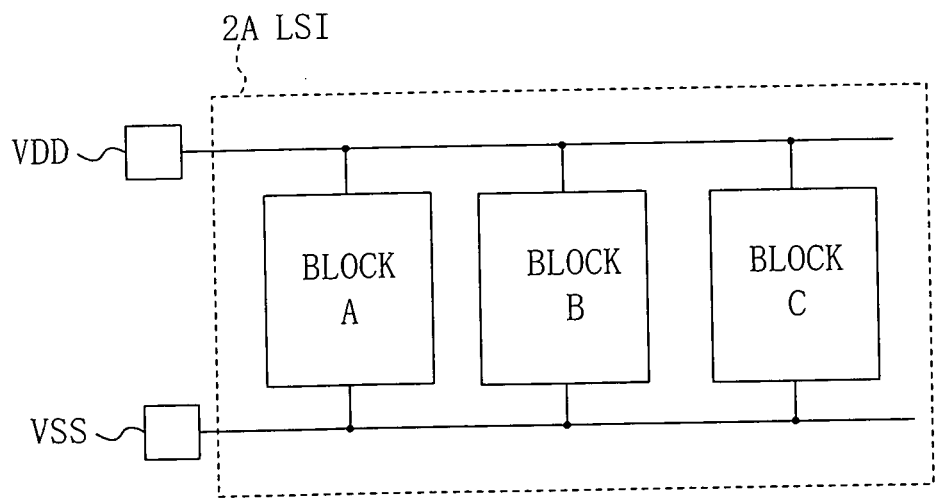
FIG. 32 conceptually illustrates a hierarchical structure of an LSI circuit.

FIG. 32 conceptually illustrates a hierarchical structure of an LSI circuit. In the state-of-the-art design methods, the LSI circuit 2A is, in general, divided into hierarchical blocks (BLOCKs A, B and C) as shown in FIG. 32 for obtaining a desired function. Especially in the case of a very large LSI circuit called a system LSI, in a widely employed method for designing the system, the entire system is not designed at one time, but the system is hierarchically divided into function blocks and designed on a block-by-block basis.

In embodiment 10, the resistance is calculated for each hierarchical block. Then, the resistance values calculated for respective one of the hierarchical blocks are used to determine the resistance value of the entire LSI circuit.

Figure 33:
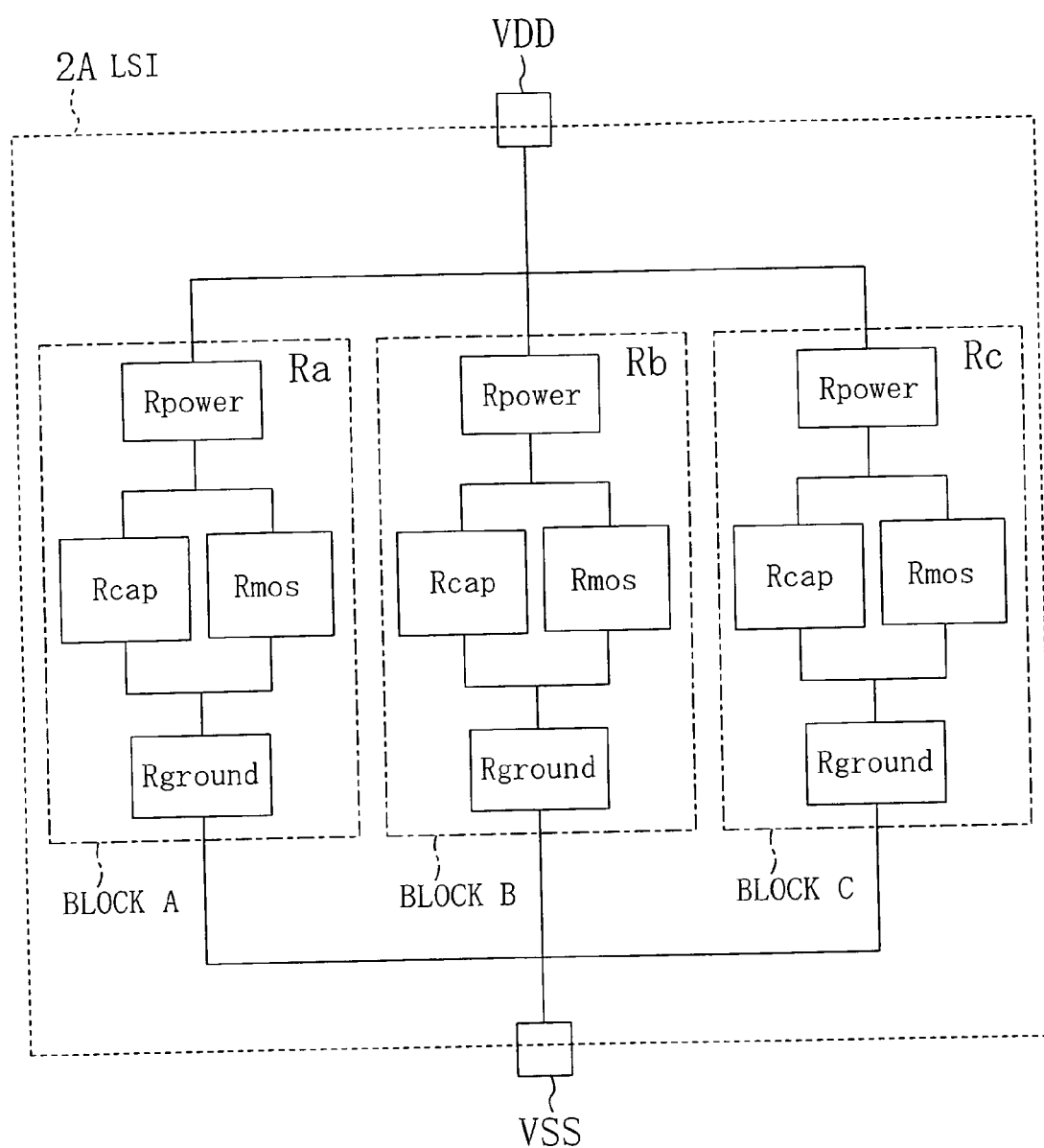
FIG. 33 is a model of the resistance inside an LSI circuit which has a hierarchical structure.

FIG. 33 is a model of the resistance inside the LSI circuit 2A which has a hierarchical structure. As shown in FIG. 33, the internal resistances of hierarchical blocks BLOCK A, B and C are each classified into four types of resistance, supply line resistance Rpower, ground line resistance Rground, decoupling capacitance resistance Rcap and MOS resistance Rmos. Supply line resistance Rpower and ground line resistance Rground are calculated by the line resistance calculation section 32 of any of the above-described embodiments. Decoupling capacitance resistance Rcap is calculated by the decoupling capacitance resistance calculation section 33. MOS resistance Rmos is calculated by the MOS resistance calculation section 34.

The resistances in the hierarchical blocks, Ra, Rb and Rc, are each expressed by the following expression:

$$Ra, Rb, Rc = R\text{power} + R\text{ground} + 1/(1/R\text{cap} + 1/R\text{mos})$$

Figure 34:
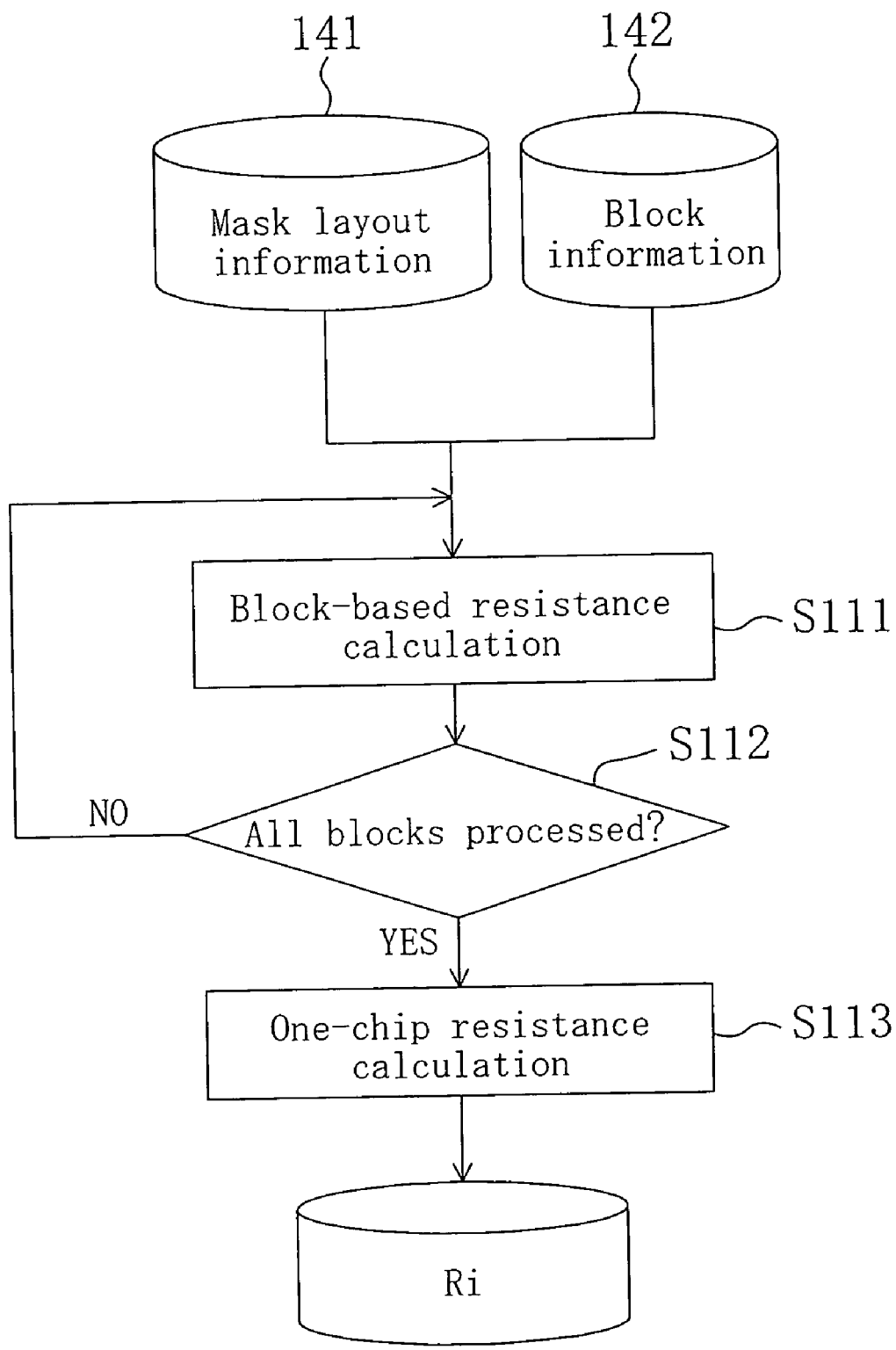
FIG. 34 illustrates the process of embodiment 10 of the present invention.

FIG. 34 illustrates a resistance value calculation method of embodiment 10. At the first step, block-based resistance calculation process S111 is performed, i.e., the resistance value is calculated on a block by block basis, using mask layout information 141 for the entirety of an LSI circuit and block information 142 indicative of the type of blocks which constitute the LSI circuit. Process S111 is performed as illustrated in FIG. 4 on all the blocks repeatedly (S112). Then, one-chip resistance calculation process S113 is performed to calculate the resistances of respective hierarchical blocks. The calculated resistances are synthesized according to the relationship of serial or parallel connection to determine resistance value Ri of one chip.

It should be noted that, in the case where a hierarchical structure is used and a plurality of hierarchical blocks of the same type are included in the structure, the resistance value once determined for one of the blocks is used again, whereby the resistance of an LSI circuit can be calculated with higher speed.

Figure 35:
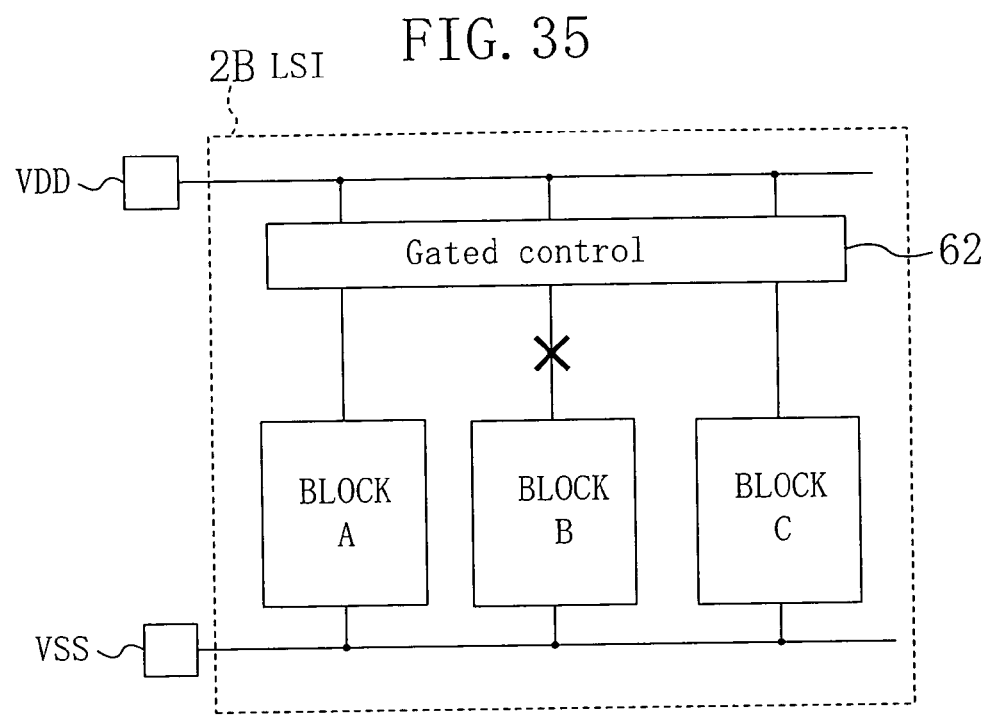
FIG. 35 conceptually illustrates an LSI circuit for interrupting the power to blocks.

As shown in FIG. 35, an LSI circuit 2B in which low power consumption is intended may have a control circuit 62 for interrupting the power to a specific block. For example, in the case where the power supply to block BLOCK_B is interrupted by the control circuit 62 in the normal mode, block-based resistance calculation process S111 is not performed on block BLOCK_B. Alternatively, it is possible to use a power supply interruption control vector to determine the execution of block-based resistance calculation process S111.

It should be noted that the above case where the block of power interruption is considered is merely an example, but it is possible to control the resistance value of a block which works in an operation mode that influences an equivalent power supply. With this, resistance estimation is realized with high accuracy.

Embodiment 11

Figure 36:
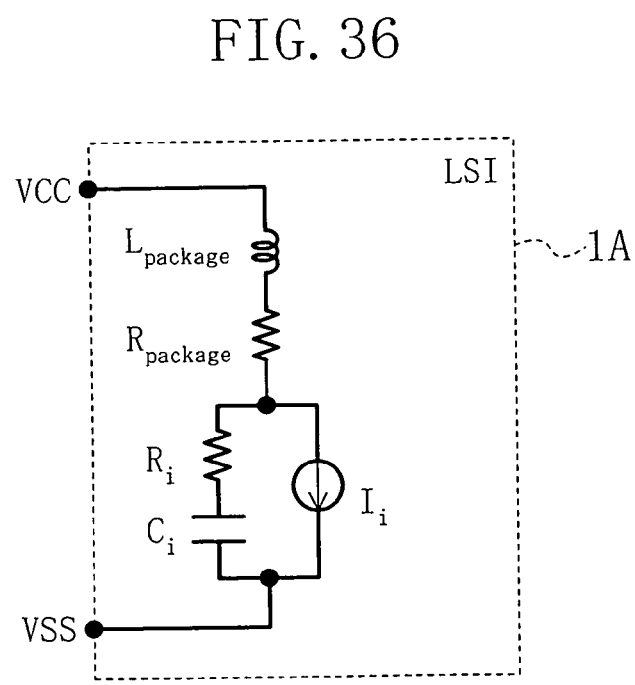
FIG. 36 illustrates an LSI internal model incorporating parasitic resistance.

An estimation method of embodiment 11 of the present invention is now described. FIG. 36 illustrates an LSI internal model formed by incorporate the parasitic resistance of a package and wire bonding into the LSI internal model of FIG. 1. The LSI internal mode 1A of FIG. 36 incorporates the parasitic resistance of a package and wire bonding (parasitic resistance Rpackage) in addition to resistance Ri, equivalent power supply capacitance Ci, equivalent package inductance Lpackage and current source Ii.

Herein, parasitic resistance Rpackage is a value unique to a package. For example, this value is once measured and stored in the form of a library so as to be readily derived. In the LSI model 1A including such a parasitic resistance, resistance Ri is estimated according to the procedure illustrated in FIG. 4.

According to embodiment 1, the parasitic resistance of a package and wire bonding (parasitic resistance Rpackage) is considered, so that EMI noise estimation is realized with higher accuracy.

Embodiment 12

Embodiment 12 of the present invention is different from embodiment 11 in that the resistance and equivalent power supply capacitance of the LSI internal model 1A shown in FIG. 36 are discretely modeled. The other features are basically the same as those of embodiment 11 except where specifically noted.

Figure 37:
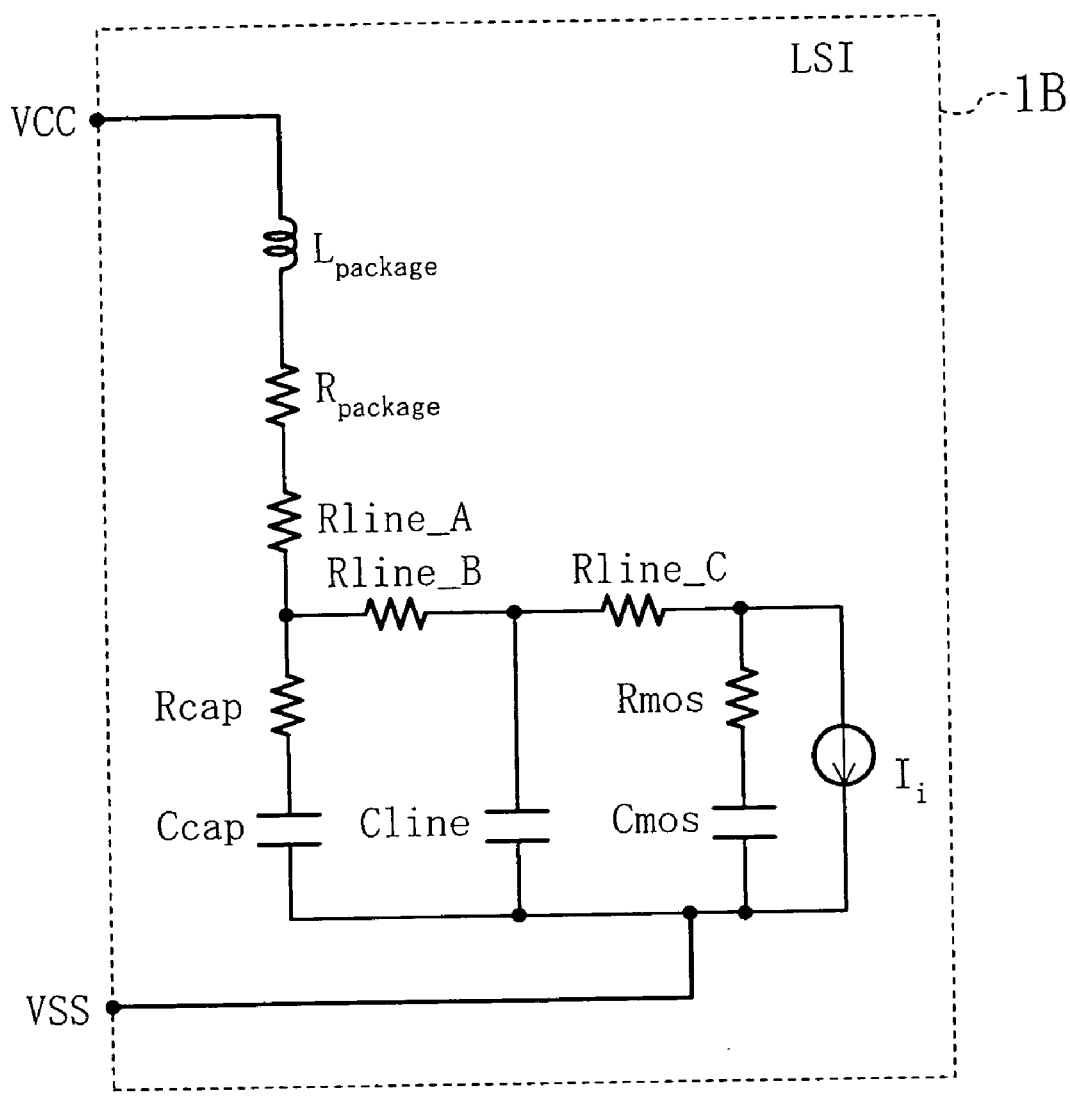
FIG. 37 is an LSI internal model in which the resistance and capacitance are discretely modeled.

FIG. 37 is an LSI internal model 1B used in embodiment 12, which is a discrete model of the resistance and equivalent power supply capacitance of the LSI internal model 1A shown in FIG. 36. That is, in the process of modeling, resistance Ri is replaced by line resistance Rline, MOS resistance Rmos and decoupling capacitance resistance Rcap, and capacitance Ci is replaced by line capacitance Cline, MOS capacitance Cmos and decoupling capacitance Ccap. Herein, line resistance Rline is further discretely modeled in the form of Rline_A, Rline_B and Rline_C based on the positional relationship between the capacitors and a MOS transistor that operates.

Figure 38:
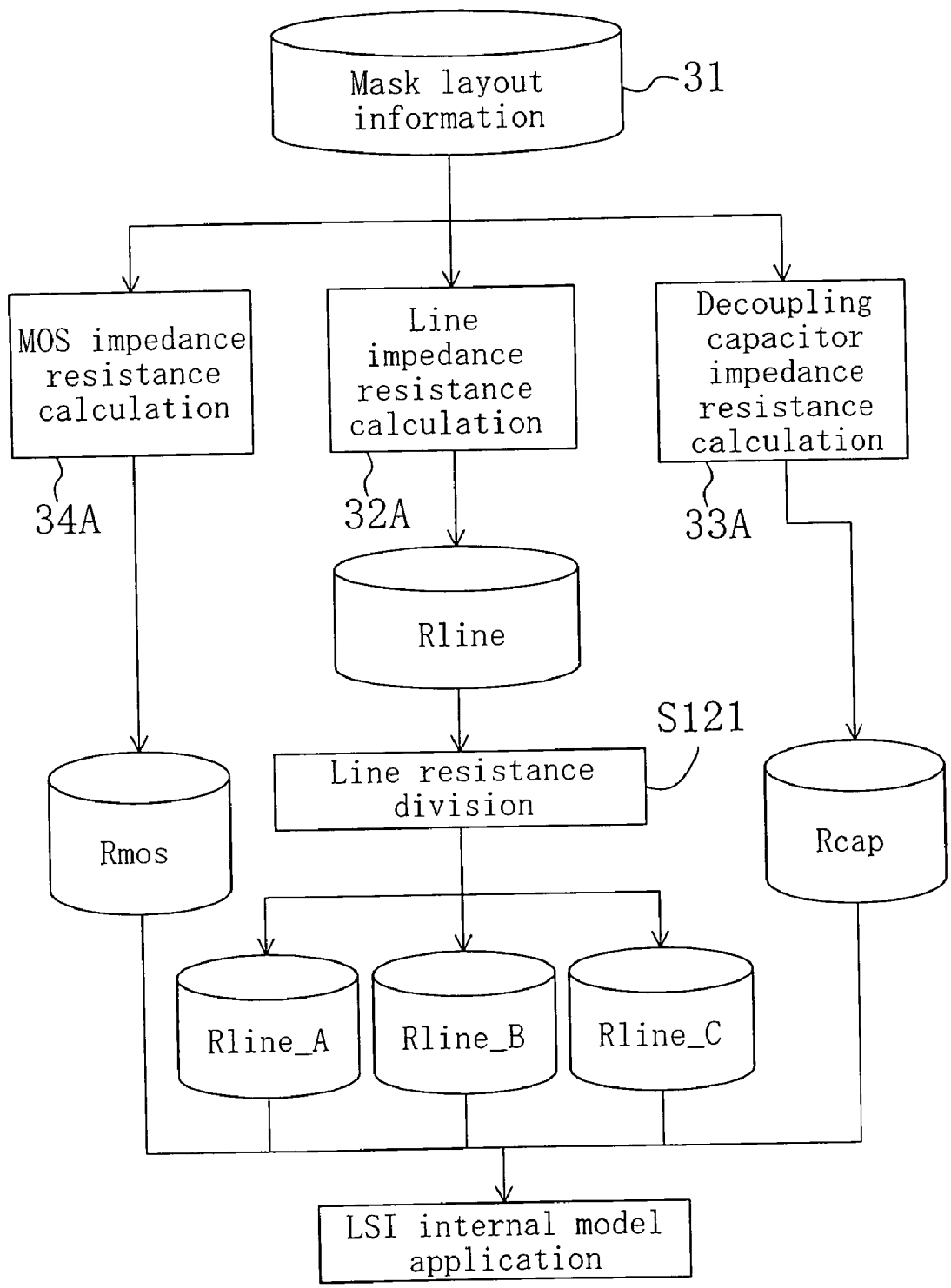
FIG. 38 illustrates the process of embodiment 12 of the present invention.

FIG. 38 illustrates an entire operation of a resistance value calculation method of embodiment 12 in which the LSI internal model shown in FIG. 37 is applied. As shown in FIG. 38, a line impedance resistance calculation section 32A uses mask layout information 31 to determine line resistance Rline, a decoupling capacitor impedance resistance calculation section 33A uses the mask layout information 81 to determine capacitor impedance resistance Rcap, and a MOS impedance resistance calculation section 34A uses the mask layout information 81 to determine MOS impedance resistance Rmos.

Figure 39:
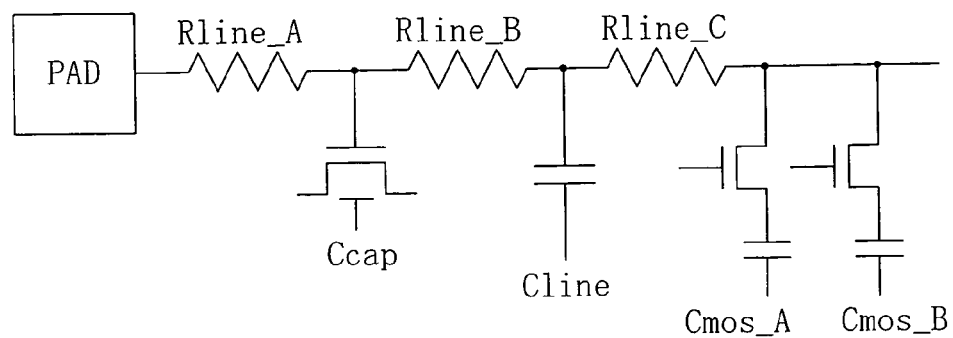
FIG. 39 illustrates a circuit model used for explaining a line resistance dividing process.

Line resistance dividing process S121 is described with reference to the conceptual diagram of FIG. 39. In FIG. 39, the electric currents supplied when MOS transistor Cmos_B operates include an electric current supplied from decoupling capacitor Ccap, an electric current supplied from line capacitance Cline, an electric current supplied from MOS transistor Cmos_A that is not operating, and an electric current supplied from a power supply pad (external terminal).

Decoupling capacitor Ccap is now considered. In the case where decoupling capacitor Ccap is distant from MOS transistor Cmos_B, decoupling capacitor Ccap is considered to be influenced by the line resistance, from which it is estimated that there are line resistances Rline_B and Rline_C. Meanwhile, MOS transistor Cmos_A that is not presently operating is not considered to be influenced by the line resistance because, in general, an operating MOS transistor is present in the vicinity of a MOS transistor that is not operating, and the distance between transistors Cmos_B and Cmos_A is very short. Thus, it is not assumed that there is a line resistance between these elements.

Next, line capacitance Cline is considered. All the lines have the line capacitances, some of which are present in the vicinity of MOS transistor Cmos_B, but others are distant from MOS transistor Cmos_B. In view of such, for the purpose of averagely estimating the line capacitance, line capacitance Cline is provided between line resistances Rline_B and Rline_C. In this way, the positional relationship of line resistances Rline_A, Rline_B and Rline_C is determined based on the positional relationship between the respective capacitors and an operating transistor.

Next, the calculation method is specifically described. At the first step, line impedance resistance Rline is determined using, for example, the method described above in embodiment 1. Line resistance Rline_A is the supply line resistance between a pad and the capacitor nearest to the pad, which can be calculated by applying the MOS resistance calculation method used in embodiment 8. Specifically, a voltage is applied to a supply line resistance network between the pad and the capacitor nearest to the pad to calculate the supply line resistance from power consumption or consumed currents according to Ohm's law. Alternatively, a line network is generated by connecting transistor resistances assumed to be 0 and capacitance resistances assumed to be 0 to a supply line resistance network and a ground line resistance network. Even if the method of embodiment 8 is used for this line network, line resistance Rline_A can be calculated.

The remainder of subtracting resistance Rline A from resistance Rline, i.e., the difference of resistance Rline and resistance Rline_A, includes resistance Rline_B and resistance Rline_C. Although resistances Rline_B and Rline_C can be determined in various ways, the values of resistances Rline_B and Rline_C are simply determined to be equal to each other in this example. As a result of the execution of line resistance dividing process S121 as described above, divisional line resistances Rline_A, Rline_B and Rline_C are determined.

As described above, in embodiment 12, the values of MOS resistance Rmos, capacitance resistance Rcap, and divisional line resistances Rline_A, Rline_B and Rline_C are discretely applied to the LSI internal model 1B shown in FIG. 37, whereby resistance estimation is realized with higher accuracy.

Figure 40:
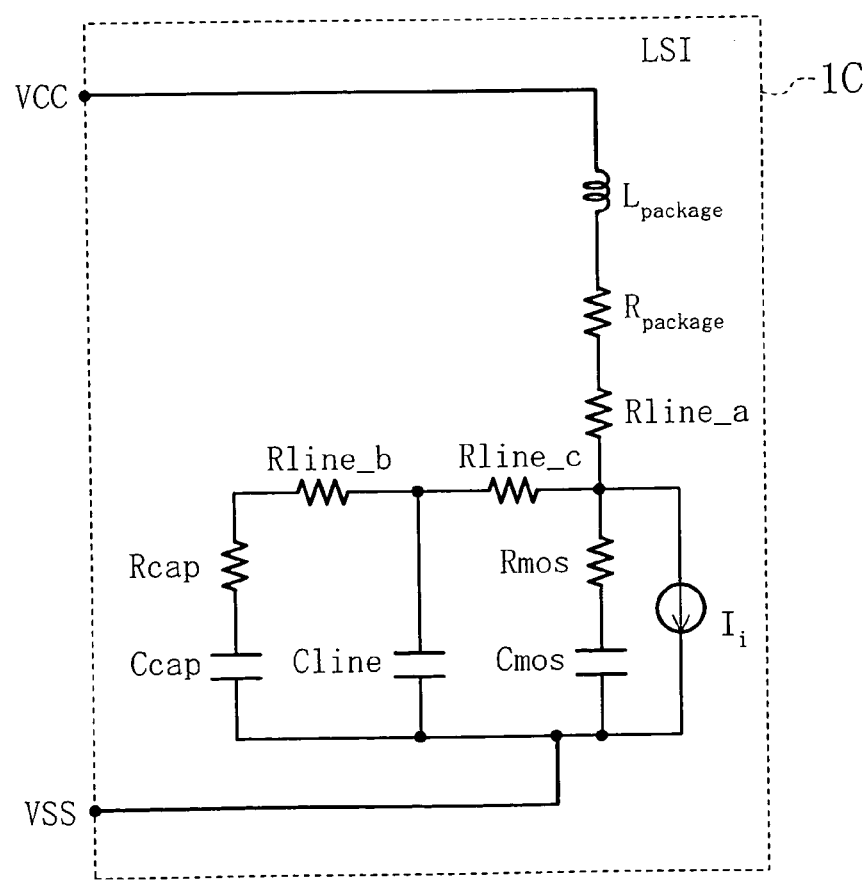
FIG. 40 is another example of the LSI internal model in which the resistance and capacitance are discretely modeled.
Figure 41:
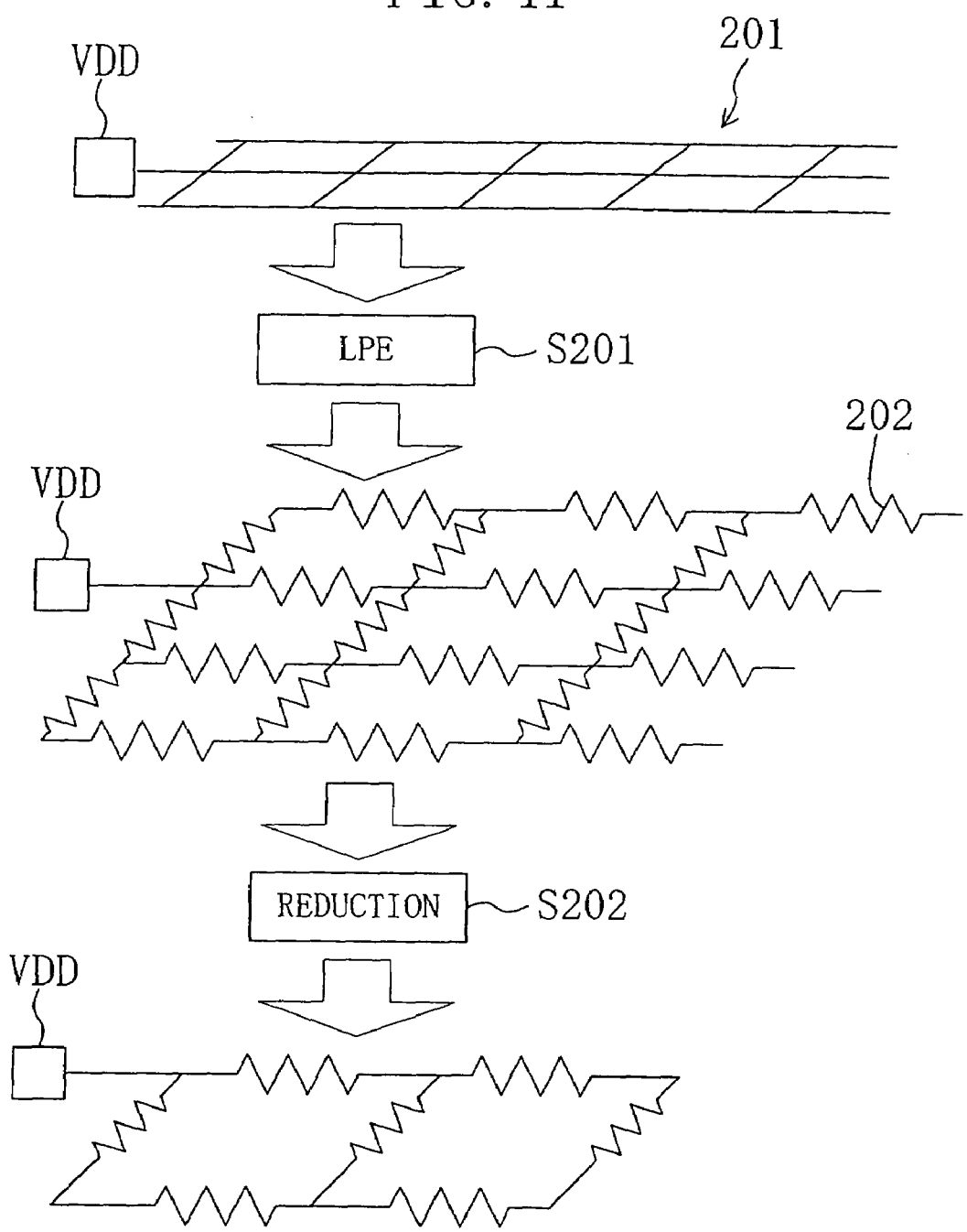
FIG. 41 illustrates a conventional method which uses a power-supply LPE method and a reduction method in the prior art.
Figure 42:
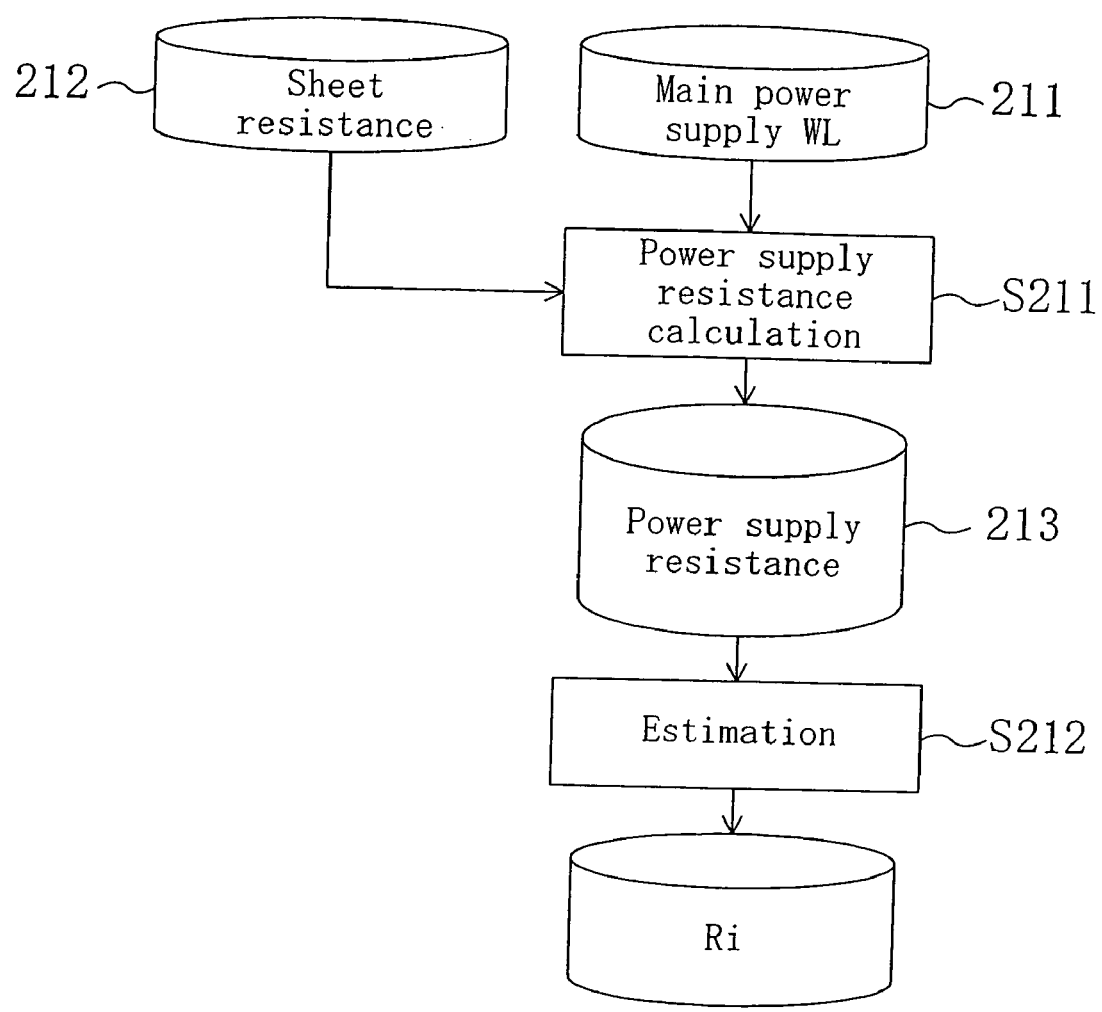
FIG. 42 illustrates another conventional method which uses a power supply resistance of a primary main power supply line in the prior art.

It should be noted that the LSI model of FIG. 37 and the operation diagram of FIG. 38 are merely exemplary. In some layouts, different discrete models, e.g., an LSI model 1C shown in FIG. 40, are possible and, as a matter of course, various processes are also possible according to the discrete model.

As described above, according to the present invention, the resistance present inside an LSI circuit is determined with high accuracy within a short time period. Thus, it is possible to estimate EMI generated by internal components of the LSI circuit, the efficiency in LSI designing and production is improved.

What is claimed is:

1. A method for estimating electromagnetic interference (EMI) of a semiconductor integrated circuit which includes first and second supply lines electrically connected to first and second external terminals and a plurality of cells which are connected between the first and second supply lines and have a transistor and a decoupling capacitor, the method comprising:

first step of calculating a first resistance value, which is a resistance value of the first and second supply lines, from mask layout information of the semiconductor integrated circuit;

second step of calculating a second resistance value, which is a resistance value of the decoupling capacitor of the plurality of cells, from the mask layout information;

third step of calculating a third resistance value, which is a resistance value of the transistor of the plurality of cells, from the mask layout information;

fourth step of calculating a resistance value between the first and second external terminals from the first to third resistance values respectively obtained by the first to third steps; and fifth step of estimating EMI of the semiconductor integrated circuit based on the resistance value between the first and second external terminals obtained in the fourth step.

2. The method of claim 1, wherein the resistance value calculated at the fourth step, Ri, is calculated by the following operation:

$$Ri = R\text{line} + (1/(1/R\text{mos} + 1/R\text{cap}))$$

where Rline, Rcap and Rmos are the first, second and third resistance values.

3. The method of claim 1, wherein in the first step the following steps are executed on each of the first and second supply lines:
   a step of determining for each of the cells on the assumption that electric currents flow through the plurality of cells a current value through each said cell and a voltage drop value at each of the first and second supply lines;
   a step of calculating a resistance value from the determined current value and voltage drop value for each of the cells;
   a step of determining a total resistance value for a case where the calculated resistance values for each of the cells is connected in parallel as a resistance value of each of the first and second supply lines; and
   a step of determining the first resistance value using the resistance value obtained for the first supply line and the resistance value obtained for the second supply line.

4. The method of claim 3, wherein the first step includes the step of performing IR-DROP simulation to determine a voltage drop value at the first and second supply lines or a cell.

5. The method of claim 1, wherein in the first step the following steps are executed on each of the first and second supply lines:
   a step of determining on the assumption that electric currents flow through the plurality of cells a total sum of the electric currents flowing through the cells and an average value of voltage drop values of the cells;
   a step of calculating a resistance value of each of the first and second supply lines from the determined total sum of the electric currents and the average value of the voltage drop values; and
   a step of determining the first resistance value using the resistance value obtained for the first supply line and the resistance value obtained for the second supply line.

6. The method of claim 5, wherein the first step includes the step of performing IR-DROP simulation to determine a voltage drop value at any one of a supply line and a cell.

7. The method of claim 1, wherein the second step includes the steps of:
   performing an LPE process on the mask layout information to obtain resistance information about each of the cells which have the decoupling capacitors;
   determining resistance values of the cells which have the decoupling capacitors from the obtained resistance information about each of the cells; and
   determining a total resistance value for a case where the determined resistance values are connected in parallel as the second resistance value.

8. The method of claim 1, wherein the third step includes the steps of:
   determining a resistance value of a cell for each cell type as a specific cell resistance;
   determining the number of cells included in the semiconductor integrated circuit for each cell type as a specific cell number;
   calculating resistance values of the cells included in the semiconductor integrated circuit for each cell type using the determined specific cell resistance and the specific cell number; and
   determining a total resistance value for a case where the determined resistance values are connected in parallel as the third resistance value.

9. The method of claim 8, wherein the step of determining the specific cell resistance includes the steps of:
   determining an average value of gate widths of transistors of said each cell type as gate width statistical information;
   determining an average value of the number of serially-connected transistors of the cells of said each cell type as intracell serial coefficient statistical information;
   determining an average value of the number of parallelly-connected transistors of the cells of said each cell type as multi-stage cell coefficient statistical information; and
   calculating a specific cell resistance of a cell of said each cell type using the gate width statistical information, the intracell serial coefficient statistical information, the multi-stage cell coefficient statistical information, an input state probability which is the probability of the transistor being turned on, and an ON-resistance value of a transistor having a predetermined gate width.

10. The method of claim 9, wherein the specific cell resistance, c, is calculated by the following operation:

$$c = (\alpha \times \gamma \times a \times w/b)/\beta$$

where $\alpha$ is the input state probability, $\gamma$ is the intracell serial coefficient statistical information, a is the ON-resistance value, w is the predetermined gate width, b is the gate width statistical information, and $\beta$ is the multi-stage cell coefficient statistical information.

11. The method of claim 1, wherein the third step includes the steps of:
   determining the resistance value of a cell only for one cell type as a specific cell resistance;
   determining the number of cells included in the semiconductor integrated circuit having the specific cell resistance; and
   determining a total resistance value for a case where the determined number of the specific cell resistances are connected in parallel as the third resistance value.

12. The method of claim 11, wherein the step of determining the specific cell resistance includes the steps of:
   determining an average value of gate widths of transistors of said one cell type as gate width statistical information;
   determining an average value of the number of serially-connected transistors of the cells of said one cell type as intracell serial coefficient statistical information;
   determining an average value of the number of parallelly-connected transistors of the cells of said one cell type as multi-stage cell coefficient statistical information; and
   calculating a specific cell resistance of a cell of said one cell type using the gate width statistical information, the intracell serial coefficient statistical information, the multi-stage cell coefficient statistical information, an input state probability which is the probability of the transistor being turned on, and an ON-resistance value of a transistor having a predetermined gate width.

13. The method of claim 12, wherein the specific cell resistance, c, is calculated by the following operation:

$$c = (\alpha \times \gamma \times a \Delta w/b)/\beta$$

where $\alpha$ is the input state probability, $\gamma$ is the intracell serial coefficient statistical information, a is the ON-resistance value, w is the predetermined gate width, b is the gate width statistical information, and $\beta$ is the multi-stage cell coefficient statistical information.

* * * * *